(12) United States Patent
Cideciyan et al.

(10) Patent No.: US 9,183,852 B2
(45) Date of Patent: Nov. 10, 2015

(54) MAGNETIC TAPE RECORDING IN DATA FORMAT USING AN EFFICIENT REVERSE CONCATENATED MODULATION CODE

(71) Applicant: International Business Machines Corporation, Armonk, NY (US)

(72) Inventors: Roy D. Cideciyan, Rueschlikon (CH); Robert A. Hutchins, Tucson, AZ (US); Thomas Mittleholzer, Zurich (CH); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/758,752

(22) Filed: Feb. 4, 2013

(65) Prior Publication Data
US 2013/0326311 A1    Dec. 5, 2013

Related U.S. Application Data

(63) Continuation of application No. 13/483,004, filed on May 29, 2012.

(51) Int. Cl.
*H03M 13/13* (2006.01)
*G11B 5/008* (2006.01)
(Continued)

(52) U.S. Cl.
CPC ........ *G11B 5/00813* (2013.01); *G11B 20/1833* (2013.01); *H03M 13/13* (2013.01);
(Continued)

(58) Field of Classification Search
CPC .............. H03M 13/2963; H03M 13/6331; H03M 5/145; H03M 13/1102; H03M 13/1515; H03M 13/2906; H03M 13/2957; H03M 13/3905; H04L 1/0057; H04L 25/03171; G11B 2020/1836; G11B 2020/185; G11B 2020/1853; G11B 20/1833; G11B 5/00813
USPC .................. 714/758, 771, 799, E11.062, 756; 360/40, 53
See application file for complete search history.

(56) References Cited

U.S. PATENT DOCUMENTS 4,888,775 A    12/1989    Karabed et al.
6,112,324 A    8/2000    Howe et al.
(Continued)

FOREIGN PATENT DOCUMENTS

CN    102272841 A    12/2011
JP    8098144 A    4/1996
(Continued)

OTHER PUBLICATIONS

Costello Jr., Daniel J., "Modern Coding Theory," Coding Research Group, Department of Electrical Engineering, University of Notre Dame, 2009 School of Information Theory, Northwestern University, Aug. 10, 2009, pp. 1-160.
(Continued)

*Primary Examiner* — Phung M Chung
(74) *Attorney, Agent, or Firm* — Zilka-Kotab, PC

(57) ABSTRACT

In one embodiment, a method for writing data to a magnetic tape utilizing a rate-(232/234) reverse concatenated modulation code includes receiving a data stream comprising one or more data sets, separating each data set into a plurality of sub data sets, encoding each sub data set with a C2 encoding, encoding each C2-encoded sub data set with the modulation code, encoding each modulated sub data set with a C1 encoding, and simultaneously writing the encoded modulated sub data sets to data tracks of the magnetic tape. Other methods for writing data to a magnetic tape utilizing a rate-(232/234) reverse concatenated modulation code are described according to various other embodiments.

15 Claims, 14 Drawing Sheets

(51) Int. Cl.
| | |
|---|---|
| G11B 20/18 | (2006.01) |
| H03M 13/29 | (2006.01) |
| H03M 5/14 | (2006.01) |
| H03M 13/11 | (2006.01) |
| H03M 13/15 | (2006.01) |

(52) U.S. Cl.
CPC ..... *H03M13/2906* (2013.01); *G11B 2020/185* (2013.01); *G11B 2020/1836* (2013.01); *G11B 2020/1853* (2013.01); *G11B 2220/90* (2013.01); *H03M 5/145* (2013.01); *H03M 13/1102* (2013.01); *H03M 13/1515* (2013.01)

(56) References Cited

U.S. PATENT DOCUMENTS

| | | | |
|---|---|---|---|
| 6,539,514 | B1 | 3/2003 | Bartlett |
| 6,757,122 | B1 | 6/2004 | Kuznetsov et al. |
| 6,895,547 | B2 | 5/2005 | Eleftheriou et al. |
| 6,901,119 | B2 | 5/2005 | Cideciyan et al. |
| 6,907,506 | B2 | 6/2005 | Proidl |
| 7,000,167 | B2 | 2/2006 | Coker et al. |
| 7,071,851 | B1 | 7/2006 | Blaum et al. |
| 7,246,294 | B2 | 7/2007 | Kauschke et al. |
| 7,266,750 | B1 | 9/2007 | Patapoutian et al. |
| 7,405,678 | B2 | 7/2008 | Cherubini |
| 7,409,622 | B1 | 8/2008 | Lu et al. |
| 7,486,208 | B2 | 2/2009 | Cideciyan et al. |
| 7,530,003 | B2 | 5/2009 | Lee et al. |
| 7,616,134 | B1 | 11/2009 | Mittelholzer |
| 7,650,561 | B1 | 1/2010 | Ulriksson et al. |
| 7,679,535 | B2 | 3/2010 | Cideciyan et al. |
| 7,725,800 | B2 | 5/2010 | Yang et al. |
| 7,827,464 | B2 | 11/2010 | Kuznetsov et al. |
| 7,873,894 | B2 | 1/2011 | Eleftheriou et al. |
| 7,876,516 | B2 | 1/2011 | Cideciyan et al. |
| 7,877,662 | B2 | 1/2011 | Eleftheriou et al. |
| 7,971,130 | B2 | 6/2011 | Ramamoorthy |
| 8,046,660 | B2 | 10/2011 | Wu et al. |
| 8,049,648 | B2 | 11/2011 | Chaichanavong |
| 8,065,585 | B1 | 11/2011 | Abbaszadeh et al. |
| 8,583,979 | B1* | 11/2013 | Zeng et al. ............... 714/752 |
| 8,595,585 | B2 | 11/2013 | Djordjevic et al. |
| 8,615,699 | B2* | 12/2013 | Eroz et al. ............... 714/758 |
| 2007/0168834 | A1* | 7/2007 | Eroz et al. ............... 714/758 |
| 2007/0288834 | A1 | 12/2007 | Crozier et al. |
| 2008/0235559 | A1 | 9/2008 | Yang |
| 2009/0235142 | A1 | 9/2009 | Galbraith et al. |
| 2010/0180180 | A1 | 7/2010 | Cideciyan et al. |
| 2010/0241923 | A1 | 9/2010 | Wang et al. |
| 2010/0241925 | A1 | 9/2010 | Wang et al. |
| 2010/0241926 | A1 | 9/2010 | Wang et al. |
| 2010/0268918 | A1 | 10/2010 | Priewasser et al. |
| 2010/0303176 | A1 | 12/2010 | Lilleberg et al. |
| 2011/0107187 | A1 | 5/2011 | Gill et al. |
| 2011/0161785 | A1 | 6/2011 | Pyndiah et al. |
| 2011/0191652 | A1 | 8/2011 | Dave et al. |
| 2011/0252290 | A1 | 10/2011 | Cideciyan et al. |
| 2011/0258509 | A1* | 10/2011 | Ramamoorthy ............. 714/752 |
| 2012/0047415 | A1 | 2/2012 | Djordjevic et al. |
| 2013/0279040 | A1 | 10/2013 | Cideciyan et al. |
| 2013/0283127 | A1 | 10/2013 | Cideciyan et al. |
| 2013/0326305 | A1 | 12/2013 | Cideciyan et al. |
| 2013/0326306 | A1 | 12/2013 | Cideciyan et al. |
| 2013/0326307 | A1 | 12/2013 | Cideciyan et al. |

FOREIGN PATENT DOCUMENTS

| | | |
|---|---|---|
| JP | 2001067813 A | 3/2001 |
| JP | 2008-146828 A | 6/2008 |
| WO | 2008/116725 A1 | 10/2008 |
| WO | 2010/078992 A1 | 7/2010 |

OTHER PUBLICATIONS

Immink et al, "Codes for Digital Recorders," 1998 IEEE, IEEE Transactions on Information Theory, vol. 44, No. 6, Oct. 1998, pp. 2260-2299.

Immink, Kees A. Schouhamer, "Codes for Mass Data Storage Systems, Second Edition," 2004 Shannon Foundation Publishers, Eindhoven, The Netherlands, www.shannonfoundation.org/book.html, pp. 1-362.

Bliss, W. G., "Circuitry for Performing Error Correction Calculations on Baseband encoded Data to Eliminate Error Propogation," IBM Technical Disclosure Bulletin, vol. 23, Mar. 1981, pp. 4633-4634.

Wijngaarden et al., "Maximum Runlength-Limited Codes with Error Control Capabilities," 2001 IEEE, IEEE Journal on Selected Areas in Communications, vol. 19, No. 4, Apr. 2001, pp. 602-611.

Blaum et al., "High-Rate Modulation Codes for Reverse Concatenation," 2007 IEEE, IEEE Transactions on Magnetics, vol. 43, No. 2, Feb. 2007, pp. 740-743.

Blaum et al., "Enumerative Encoding with Non-Uniform Modulation Constraints," 2007 IEEE, ISIT2007, Nice, France, Jun. 24-Jun. 29, 2007, pp. 1831-1835.

"White Paper Blu-ray Disc Format, 1.A Physical Format Specifications for BD-RE, 3rd Edition," Blu-ray Disc Association, Oct. 2010, pp. 1-42.

"White Paper Blu-ray Disc Format, 1.B Physical Format Specifications for BD-R, 5th Edition," Blu-ray Disc Association, Oct. 2010, pp. 1-39.

"White Paper Blu-ray Disc Format, 1.C Physical Format Specifications for BD-ROM, 6th Edition," Blu-ray Disc Association 2010, pp. 1-48.

Asthana et al., "Rewritable Optical Disk Drive Technology," 1996 IBM, IBM Journal of Research and Development, vol. 40, No. 5, Sep. 1996, pp. 543-558.

Coene et al., "Channel Coding and Signal Processing for Optical Recording Systems Beyond DVD," 2001 IEEE, IEEE Transactions on Magnetics, vol. 37, No. 2, Mar. 2001, pp. 682-688.

Choi, GoangSeog, "The Front-End SOC for a Blu-ray Disc Recorder," 2004 IEEE, IEEE Communications Magazine, Topics in Curcuits for Communications, Dec. 2004, pp. 124-131.

Narahara et al., "Optical Disc System for Digital Video Recording," 2000 Japanese Journal of Applied Physics Publication Board, Japanese Journal of Applied Physics, vol. 39, Part 1, No. 2B, Feb. 2000, pp. 912-919.

Immink, Kees A. Schouhamer, "A Survey of Codes for Optical Disk Recording," 2001 IEEE, IEEE Journal on Selected Areas in Communications, vol. 19, No. 4, Apr. 2001, pp. 756-764.

Mittelholzer et al., "Reverse Concatenation of Product and Modulation Codes," 2008 IEEE, IEEE Communications Society, ICC 2008, pp. 1991-1995.

Mittelholzer, T, "Enumerative Maximum-Transition-Run Codes," 2009 IEEE, ISIT 2009, Seoul, Korea, Jun. 28-Jul. 3, 2009, pp. 1549-1553.

"International Magnetic Tape Storage Technology Roadmap Workshop," INSIC, Information Storage Industry Consortium, Broomfield, CO, USA, Aug. 24-25, 2011, 5 pgs.

Solowiejczyk, Ivy J., "DOTS Technology Introduction," Group 47, LLC, IBM, Jan. 30, 2012, pp. 1-10.

Cideciyan et al., "Maximum Transition Run Codes for Generalized Partial Response Channels," 2001 IEEE, IEEE Journal on Selected Areas in Communications, vol. 19, No. 4, Apr. 2001, pp. 619-634.

Cideciyan et al., "A PRML System for Digital Magnetic Recording," 1992 IEEE, IEEE Journal on Selected Areas in Communications, vol. 10, No. 1, Jan. 1992, pp. 38-56.

Blahut, R.E., "Algebraic Codes for Data Transmission: Ch. 10 Beyond BCH Codes," Cambridge University Press 2003, 8 pages.

U.S. Appl. No. 13/483,004, filed May 29, 2012.

International Search Report and Written Opinion from PCT Application No. PCT/EP2013/060100 dated Sep. 16, 2013.

Blaum et al., "Reverse Concatenation with Maximum Transition Run (MTR) Codes for High-Density Perpendicular Recording," 2008 IEEE, Global Telecommunications Conference 2008, Nov. 30, 2008, pp. 1-4.

(56) References Cited

OTHER PUBLICATIONS

Sawaguchi et al., "Iterative Decoding for Concatenated Error Correction Coding in PRML Channel Systems," 1999 IEEE, Global Telecommunications Conference—Globecom '99, pp. 749-754.
Fan et al., "Constraint Gain," 2004 IEEE, IEEE Transactions on Information Theory, vol. 50, No. 9, Sep. 2004, pp. 1989-2001.
"QuickSpecs HP StorageWorks LTO Ultrium Tape Drive," Worldwide QuickSpecs—Version 2, Jun. 18, 2010, pp. 1-35.
Karp et al., "IBM TS1140 Tape Drive—Technology, Features and Function Whitepaper," 2011 IBM Corporation, IBM Systems Storage, Oct. 2011, pp. 1-44.
Argumedo et al., "Scaling tape-recording areal densitites to 100 Gb/in2," 2008 IBM, IBM Journal of Research and Development, vol. 52, No. 4/5, Jul./Sep. 2008, pp. 513-527.
Immink et al., "Extremely Efficient DC-Free RLL Codes for Optical Recording," 2001 IEEE, IEEE Transactions on Consumer Electronics, vol. 47, No. 4, Nov. 2001, pp. 910-914.
Sawaguchi et al., "A Concatenated Coding Technique for Partial Response Channels," 2001 IEEE, IEEE Transactions on Magnetics, vol. 37, No. 2, Mar. 2001, pp. 695-703.
Benedetto et al., "A Soft-Input Soft-Output Maximum A Posteriori (MAP) Module to Decode Parallel and Serial Concantenated Codes," TDA Progress Report 42-127, Nov. 15, 1996, pp. 1-20.
Blanksby et al., "A 690-mW 1-Gb/s 1024-b, Rate-1/2 Low-Density Parity-Check Code Decoder," 2002 IEEE, IEEE Journal of Solid-State Circuits, vol. 37, No. 3, Mar. 2002, pp. 404-412.
Ratnayake et al., "A High-Throughput Maximum a Posteriori Probability Detector," 2008 IEEE, IEEE Journal of Solid-State Circuits, vol. 43, No. 8, Aug. 2008, pp. 1846-1858.
Niktash et al., "RECFEC: A Reconfigurable FEC Processor for Viterbi, Turbo, Reed-Solomon and LDPC Coding," 2008 IEEE, IEEE Communications Society, WCNC 2008 Proceedings, pp. 605-610.
Viterbi, Andrew J., "An Intuitive Justification and a Simplified Implementation of the MAP Decoder for Convolutional Codes," 1998 IEEE, IEEE Journal on Selected Areas in Communications, vol. 16, No. 2, Feb. 1998.
Robertson et al., "Optimal and Sub-Optimal Maximum A Posteriori Algorithms Suitable for Turbo Decoding," European Transactions on Telecommunications, vol. 8, No. 2, pp. 119-125, Mar.-Apr. 1997.
International Search Report and Written Opinion from PCT application No. PCT/CN2013/072908 dated Jun. 27, 2013.
Non-Final Office Action from U.S. Appl. No. 13/454,935 dated Oct. 24, 2013.
Notice of Allowance and Fee(s) Due from U.S. Appl. No. 13/454,935 dated Feb. 21, 2014.
U.S. Appl. No. 13/483,026, filed May 29, 2012.
U.S. Appl. No. 13/483,015, filed May 29, 2013.
Non-Final Office Action from U.S. Appl. No. 13/483,004 dated Jul. 16, 2014.
Non-Final Office Action from U.S. Appl. No. 13/483,015 dated Jul. 15, 2014.
Non-Final Office Action from U.S. Appl. No. 13/483,026 dated Apr. 10, 2014.
Final Office Action from U.S. Appl. No. 13/483,004, dated Jan. 29, 2015.
Final Office Action from U.S. Appl. No. 13/483,015, dated Jan. 28, 2015.
Advisory Action from U.S. Appl. No. 13/483,026, dated Jan. 14, 2015.
Final Office Action from U.S. Appl. No. 13/483,026, dated Oct. 23, 2014.
Advisory Action from U.S. Appl. No. 13/483,015, dated Apr. 14, 2015.
Notice of Allowance from U.S. Appl. No. 13/483,004, dated Apr. 13, 2015.
Notice of Allowance from U.S. Appl. No. 13/483,026, dated Apr. 14, 2015.
Notice of Allowance from U.S. Appl. No. 13/483,026, dated Jun. 22, 2015.
Notice of Allowance from U.S. Appl. No. 13/483,004, dated Jul. 2, 2015.
Corrected Notice of Allowance from U.S. Appl. No. 13/483,004, dated Jul. 30, 2015.
Office Action from Chinese Application No. 201310203913.9, dated Sep. 8, 2015.

\* cited by examiner

Left part of check-node connectivity matrix

| m-th check node | n-th symbol node | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| 0 | 68 | 94 | 100 | 197 | 300 | 384 | 403 | 476 | 569 | 683 | 697 | 733 | 764 | 895 | 972 | 974 | 978 | 994 | 1052 | 1079 | 1145 |
| 1 | 34 | 59 | 63 | 66 | 72 | 121 | 240 | 391 | 460 | 483 | 729 | 853 | 926 | 1035 | 1078 | 1081 | 1098 | 1130 | 1181 | 1213 | 1243 |
| 2 | 62 | 153 | 171 | 263 | 532 | 567 | 615 | 651 | 663 | 728 | 771 | 828 | 927 | 964 | 1077 | 1080 | 1152 | 1161 | 1193 | 1232 | 1240 |
| 3 | 31 | 75 | 187 | 289 | 311 | 453 | 552 | 593 | 602 | 610 | 654 | 672 | 683 | 758 | 778 | 807 | 826 | 887 | 919 | 958 | 963 |
| 4 | 15 | 30 | 37 | 64 | 74 | 110 | 114 | 136 | 209 | 235 | 267 | 305 | 374 | 375 | 408 | 450 | 474 | 556 | 597 | 611 | 634 |
| 5 | 18 | 69 | 76 | 124 | 141 | 225 | 251 | 283 | 359 | 400 | 437 | 503 | 514 | 536 | 598 | 665 | 674 | 688 | 710 | 766 | 774 |
| 6 | 71 | 143 | 208 | 217 | 218 | 241 | 244 | 249 | 279 | 349 | 360 | 480 | 594 | 641 | 724 | 735 | 808 | 934 | 977 | 991 | 1016 |
| 7 | 40 | 103 | 177 | 207 | 325 | 405 | 417 | 449 | 470 | 473 | 633 | 698 | 722 | 734 | 840 | 904 | 937 | 967 | 1010 | 1022 | 1115 |
| 8 | 77 | 78 | 87 | 105 | 188 | 306 | 323 | 330 | 444 | 547 | 559 | 640 | 703 | 842 | 864 | 966 | 1019 | 1023 | 1059 | 1099 | 1110 |
| 9 | 17 | 148 | 160 | 162 | 198 | 301 | 436 | 439 | 443 | 475 | 509 | 516 | 525 | 570 | 572 | 642 | 702 | 746 | 925 | 968 | 979 |
| 10 | 14 | 43 | 44 | 79 | 120 | 165 | 253 | 257 | 329 | 340 | 365 | 404 | 512 | 517 | 539 | 622 | 671 | 753 | 776 | 879 | 907 |
| 11 | 11 | 134 | 199 | 224 | 273 | 277 | 348 | 497 | 643 | 670 | 684 | 692 | 715 | 757 | 782 | 790 | 892 | 918 | 963 | 961 | 975 |
| 12 | 8 | 80 | 90 | 113 | 117 | 172 | 189 | 239 | 386 | 412 | 429 | 434 | 629 | 639 | 761 | 824 | 867 | 988 | 1044 | 1064 | 1082 |
| 13 | 47 | 129 | 139 | 179 | 261 | 341 | 356 | 425 | 459 | 471 | 509 | 519 | 533 | 534 | 578 | 605 | 609 | 638 | 681 | 796 | 857 |
| 14 | 3 | 6 | 9 | 21 | 24 | 27 | 178 | 245 | 265 | 346 | 418 | 500 | 528 | 550 | 607 | 618 | 636 | 647 | 668 | 679 | 955 |
| 15 | 0 | 12 | 32 | 81 | 144 | 146 | 291 | 302 | 339 | 358 | 474 | 544 | 583 | 606 | 659 | 747 | 788 | 845 | 964 | 982 | 1003 |
| 16 | 35 | 50 | 82 | 83 | 92 | 229 | 234 | 367 | 372 | 393 | 396 | 422 | 466 | 469 | 508 | 575 | 601 | 718 | 844 | 856 | 993 |
| 17 | 221 | 290 | 317 | 472 | 522 | 574 | 585 | 673 | 709 | 804 | 813 | 869 | 873 | 1041 | 1053 | 1136 | 1182 | 1210 | 1241 | 1242 | 1302 |
| 18 | 38 | 93 | 243 | 320 | 321 | 331 | 495 | 543 | 562 | 577 | 595 | 600 | 614 | 657 | 666 | 682 | 945 | 1159 | 1171 | 1183 | 1297 |
| 19 | 99 | 180 | 193 | 212 | 296 | 312 | 337 | 347 | 363 | 379 | 395 | 428 | 488 | 506 | 537 | 542 | 555 | 596 | 740 | 810 | 834 |
| 20 | 41 | 53 | 151 | 168 | 282 | 345 | 491 | 511 | 531 | 579 | 617 | 700 | 712 | 846 | 855 | 898 | 956 | 957 | 1026 | 1127 | 1215 |
| 21 | 45 | 84 | 146 | 163 | 211 | 269 | 271 | 313 | 377 | 390 | 442 | 467 | 510 | 553 | 650 | 765 | 809 | 865 | 891 | 999 | 1047 |
| 22 | 85 | 86 | 132 | 137 | 161 | 170 | 238 | 307 | 364 | 376 | 426 | 441 | 479 | 494 | 554 | 581 | 645 | 652 | 677 | 707 | 732 |
| 23 | 98 | 112 | 156 | 200 | 210 | 228 | 247 | 278 | 336 | 355 | 397 | 402 | 433 | 465 | 478 | 502 | 616 | 625 | 691 | 769 | 792 |
| 24 | 16 | 48 | 109 | 149 | 201 | 202 | 256 | 292 | 437 | 438 | 447 | 493 | 513 | 548 | 653 | 690 | 716 | 723 | 759 | 784 | 837 |
| 25 | 19 | 56 | 102 | 233 | 274 | 357 | 368 | 430 | 446 | 563 | 583 | 708 | 711 | 727 | 775 | 797 | 874 | 876 | 949 | 1012 | 1045 |
| 26 | 225 | 263 | 286 | 298 | 313 | 332 | 429 | 496 | 571 | 616 | 622 | 904 | 955 | 1031 | 1036 | 1042 | 1065 | 1130 | 1131 | 1184 | 1235 |
| 27 | 37 | 55 | 56 | 111 | 137 | 201 | 242 | 287 | 358 | 458 | 463 | 555 | 579 | 594 | 603 | 628 | 666 | 751 | 764 | 942 | 943 |
| 28 | 106 | 234 | 269 | 308 | 318 | 360 | 379 | 484 | 495 | 613 | 688 | 689 | 704 | 716 | 727 | 739 | 747 | 757 | 802 | 836 | 987 |
| 29 | 8 | 73 | 78 | 114 | 134 | 169 | 251 | 319 | 449 | 451 | 499 | 560 | 664 | 746 | 773 | 781 | 818 | 879 | 932 | 965 | 980 |
| 30 | 4 | 21 | 42 | 57 | 117 | 131 | 208 | 258 | 314 | 320 | 341 | 350 | 352 | 376 | 506 | 557 | 568 | 678 | 755 | 788 | 823 |
| 31 | 41 | 81 | 123 | 128 | 271 | 277 | 279 | 326 | 342 | 344 | 351 | 370 | 402 | 434 | 554 | 591 | 646 | 653 | 709 | 720 | 738 |
| 32 | 156 | 244 | 259 | 268 | 290 | 382 | 430 | 507 | 621 | 642 | 679 | 695 | 730 | 765 | 787 | 834 | 844 | 892 | 914 | 951 | 973 |
| 33 | 0 | 40 | 58 | 166 | 198 | 289 | 383 | 386 | 396 | 397 | 423 | 577 | 629 | 673 | 863 | 893 | 936 | 971 | 1006 | 1061 | 1070 |
| 34 | 76 | 84 | 162 | 220 | 241 | 325 | 330 | 336 | 354 | 404 | 414 | 431 | 454 | 488 | 610 | 667 | 772 | 841 | 878 | 899 | 938 |
| 35 | 63 | 205 | 215 | 227 | 413 | 415 | 456 | 532 | 545 | 668 | 729 | 740 | 848 | 871 | 1003 | 1038 | 1082 | 1134 | 1186 | 1194 | 1208 |
| 36 | 16 | 87 | 163 | 167 | 239 | 249 | 278 | 299 | 446 | 459 | 492 | 556 | 572 | 748 | 774 | 790 | 877 | 907 | 944 | 995 | 1083 |

MAGNETIC TAPE RECORDING IN DATA FORMAT USING AN EFFICIENT REVERSE CONCATENATED MODULATION CODE

RELATED APPLICATIONS

The present application is a continuation of copending U.S. patent application Ser. No. 13/483,004, filed May 29, 2012; which is herein incorporated by reference.

Furthermore, the present application is related to U.S. patent application Ser. No. 13/483,015, entitled "Partial Reverse Concatenation for Data Storage Devices Using Composite Codes" to Roy Cideciyan et al. filed May 29, 2012; and to U.S. patent application Ser. No. 13/483,026 entitled "Methods for Partial Reverse Concatenation for Data Storage Devices Using Composite Codes" to Roy Cideciyan et al., filed May 29, 2012, which are herein incorporated by reference.

BACKGROUND

The present invention relates to a magnetic tape data storage format, and more particularly, to storing data on a magnetic tape using a reverse concatenated modulation code with a low-density parity check (LDPC) code.

It has been projected that the capacity of magnetic tape cartridges will double every two years with an annual compounded growth rate of 41.42%, according to "International Magnetic Tape Storage Roadmap," Information Storage Industry Consortium, September 2008. As the capacities increase, virtually all areas of tape recording systems will be improved in order to accommodate the additional storage. For example, improvements probably will be made to the recording media, the read/write heads, the recording channel, and servo technologies, and the overall data format.

For example, in the current generation of IBM 3592 and linear tape-open (LTO) tape drives, data is protected by two orthogonal Reed-Solomon error correction codes referred to as C1 and C2. Unencoded data is received by a write formatter and additional parity bytes are added according to the C1 and C2 encoding algorithm. Once the C1 and C2 parity bytes are added, the data is processed by a rate 32/33 run length limited modulation code.

After modulation encoding, the data is ready to be written to a magnetic tape. The problem with this architecture is that the modulation code is inserted between the error correction codes (ECCs) and the data as it is written on the magnetic tape. On the read side, modern error correction methodologies, such as LDPC codes or soft Reed-Solomon detectors, require that the information received from the data detector include the associated synchronous data samples. These data detectors are referred to as 'soft detectors.' It is not possible to perform soft detection using current data structures. This is because the data from the data detector is first processed by the modulation decoder and then processed by the C1 code. Any channel information relative to the detected bits is removed by the modulation decoder which simply outputs bits. Thus, soft detectors cannot be used with the current data format architecture. Accordingly, it would be beneficial to have a data format architecture which alleviates this problem.

BRIEF SUMMARY

In one embodiment, a method for writing data to a magnetic tape utilizing a rate-(232/234) reverse concatenated modulation code includes receiving a data stream including one or more data sets, separating each data set into a plurality of sub data sets, encoding each sub data set with a C2 encoding, encoding each C2-encoded sub data set with a modulation code, encoding each modulated sub data set with a C1 encoding, and simultaneously writing the encoded modulated sub data sets to data tracks of the magnetic tape.

Other aspects and embodiments of the present invention will become apparent from the following detailed description, which, when taken in conjunction with the drawings, illustrates by way of example the principles of the invention.

BRIEF DESCRIPTION OF THE SEVERAL VIEWS OF THE DRAWINGS

FIGS. 6A-6F show an example of creating parity check bits using an H-matrix, according to one embodiment.

DETAILED DESCRIPTION

Figure 1:
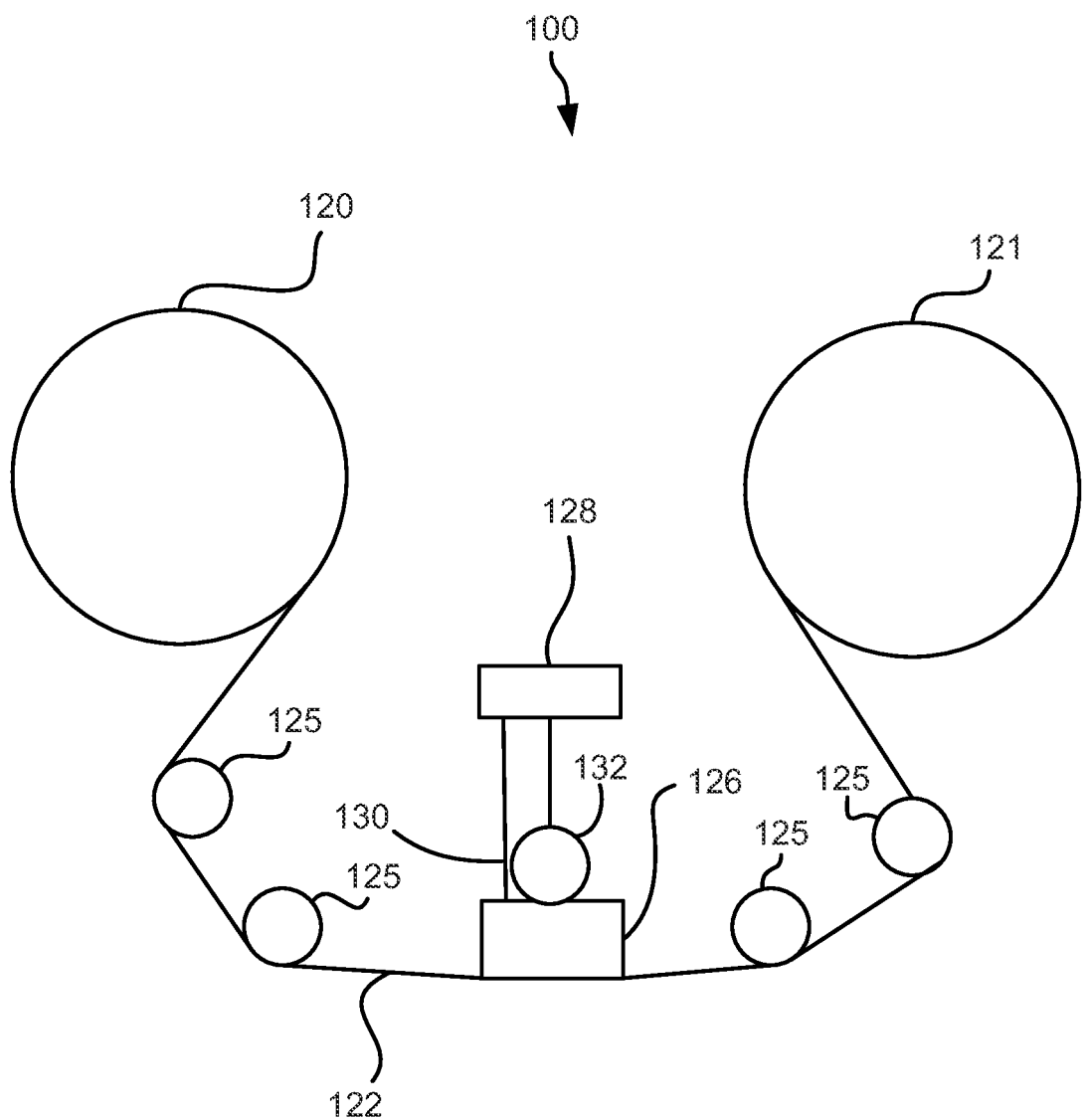
FIG. 1 illustrates a simplified tape drive of a tape-based data storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, a magnetic tape may employ a data format where an efficient reverse concatenated modulation code is inserted between a Reed-Soloman C2 error correcting code (ECC) and a low density parity check (LDPC) code C1.

In one general embodiment, a tape drive system includes a write channel for writing data to a magnetic tape, the write channel utilizing a rate-(232/234) reverse concatenated modulation code. The write channel includes logic adapted for receiving a data stream comprising one or more data sets, logic adapted for separating each data set into a plurality of sub data sets, logic adapted for encoding each sub data set with a C2 encoding, logic adapted for encoding each C2-encoded sub data set with a modulation code, logic adapted for encoding each modulated sub data set with a C1 encoding, and logic adapted for simultaneously writing the encoded modulated sub data sets to data tracks of the magnetic tape.

In another general embodiment, a method for writing data to a magnetic tape utilizing a rate-(232/234) reverse concatenated modulation code includes receiving a data stream including one or more data sets, separating each data set into a plurality of sub data sets, encoding each sub data set with a C2 encoding, encoding each C2-encoded sub data set with a modulation code, encoding each modulated sub data set with a C1 encoding, and simultaneously writing the encoded modulated sub data sets to data tracks of the magnetic tape.

In yet another general embodiment, a tape drive system adapted for writing data to a magnetic tape utilizing a rate-(232/234) reverse concatenated modulation code includes logic adapted for receiving a data stream including one or more data sets, logic adapted for separating each data set into sixty-four sub data sets, each sub data set organized as an 84×918-byte matrix being 77,112 bytes in size, logic adapted for encoding each sub data set with a C2 encoding by adding twelve bytes of a (96,84,13) Reed-Solomon C2 ECC to each 84-byte column of each sub data set's matrix, creating a 96×918-byte matrix being 88,128 bytes in size, logic adapted for headerizing each C2-encoded sub data set by adding a 10-byte header to each row of each C2-encoded sub data set's 96×918-byte matrix to create a 96×928-byte matrix being 89,088 bytes in size, logic adapted for randomizing each row (CW-4) of each headerized sub data set's 96×928-byte matrix to create a randomized 96×928-byte matrix, logic adapted for encoding each C2-encoded sub data set with a modulation code by applying a (234,232) modulation code to each randomized 96×928-byte matrix by extending a length of each CW-4 by eight bytes to create a 96×936-byte matrix being 89,856 bytes in size, logic adapted for encoding each modulated sub data set with a C1 encoding by applying a (1992, 1872) LDPC code to each modulation-encoded sub data set by concatenating four LDPC codewords to each CW-4 to create a 96×996-byte matrix being 95,616 bytes in size, and logic adapted for simultaneously writing the modulation-encoded sub data sets to data tracks of the magnetic tape by writing designated CW-4's in sets of 32.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a simplified tape drive 100 of a tape-based data storage system, which may be employed according to various embodiments. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type. The drive motor(s) may be considered a drive mechanism for passing the magnetic tape 122 over the magnetic head 126.

Guides 125 guide the tape 122 across the tape head 126. Such tape head 126 is in turn coupled to a controller assembly 128 via a cable 130. The controller 128 typically comprises a servo channel and controls head functions, such as track following, writing, reading, etc. The cable 130 may include read/write circuits to transmit data to the head 126 to be recorded on the tape 122 and to receive data read by the head 126 from the tape 122. An actuator 132 determines position of the head 126 relative to the tape 122.

An interface may also be provided for communication between the tape drive 100 and a host (integral or external) to send and receive the data and for controlling the operation of the tape drive 100 and communicating the status of the tape drive 100 to the host, all as will be understood by those of skill in the art.

According to one embodiment, an efficient rate-232/234 reverse concatenated modulation code may be inserted between a Reed-Solomon C2 ECC and an LDPC C1 code. Some advantages of such an architecture may include a more efficient modulation code, e.g., a rate-232/234 (99% efficient) modulation code versus a rate-32/33 (97% efficient) modulation code; the C1 encoding/decoding may utilize an LDPC code which is more powerful that the currently used Reed-Solomon code; data detection/decoding may be performed using iteration in the detector and iteration in the decoder, such that soft detection is enabled; and the data structure and data flow for the encoding/decoding of data may be similar to the existing data structure and data flow for 3592 data architecture.

The following descriptions are for an LDPC based error correction system for a 32-track magnetic tape drive. Of course, the systems and associated methodology described herein may be implemented in a tape drive using more or less than 32 tracks, such as 16 tracks, 8 tracks, 64 tracks, etc. An alternative LDPC-based error correction system is described and contrasted with conventionally used systems, according to various examples. Some assumptions are made in the examples, specifically that (234,232) reverse concatenated modulation code is used and that (1992,1872) LDPC code is used. Note that this is done solely to place the examples in a context and to assist the reader. Furthermore, reverse concatenated modulation codes may be used as full reverse codes or partial reverse codes, according to various embodiments. It should be understood that other types of error correction code may be used in the various permutations and combinations of the plethora of possible embodiments of the present invention.

Figure 2:
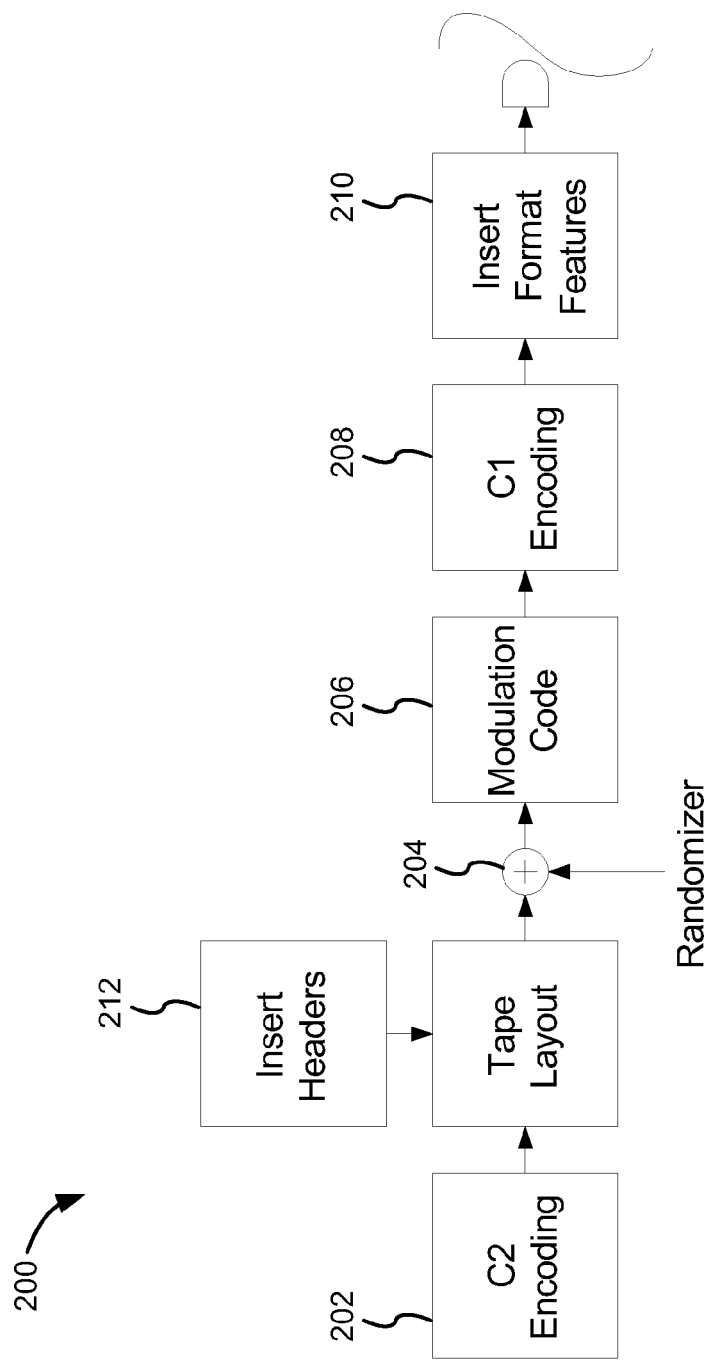
FIG. 2 shows a block diagram of a low-density parity check (LDPC) write format architecture, according to one embodiment.

Now referring to FIG. 2, a block diagram of a write format architecture 200 is shown according to one embodiment. The process flow through this block diagram is from left to right.

A Sub Data Set, as used herein, is a basic data unit processed by the ECC algorithm. The Sub Data Set includes 77,112 bytes organized as an 84×918-byte matrix, according to one embodiment, specific to a 32-track magnetic tape format. 64 Sub Data Sets may be constructed from each Data Set or file.

The first Sub Data Set may be filled by placing the first Data Set byte into row 0, column 0 of the Sub Data Set and continuing as shown in Table 1, according to one embodiment, where the numbers in the table represent the bytes of the Data Set. Subsequent Sub Data Sets may be filled in a similar manner, in order, until all Data Sets have been processed.

TABLE 1

| | Sub Data Set | | | | | | | | | |
|---|---|---|---|---|---|---|---|---|---|---|
| | 0 | 1 | 2 | 3 | 4 | ... | 913 | 914 | 915 | 916 | 917 |
| 0 | 0 | 1 | 2 | 3 | 4 | ... | 913 | 914 | 915 | 916 | 917 |
| 1 | 918 | 919 | 920 | 921 | 922 | ... | 1831 | 1832 | 1833 | 1834 | 1835 |
| . | . | . | . | . | . | | . | . | . | . | . |
| . | . | . | . | . | . | | . | . | . | . | . |
| 82 | 75276 | 75277 | 75278 | 75279 | 75280 | ... | 76189 | 76190 | 76191 | 76192 | 76193 |
| 83 | 76194 | 76195 | 76196 | 76197 | 76198 | ... | 77107 | 77108 | 77109 | 77110 | 77111 |

Each Sub Data Set is then processed using C2 encoding, as shown in block 202 of FIG. 2, according to one embodiment. The C2 Encoded Sub Data Set may be the result of processing a Sub Data Set by the C2 ECC algorithm. The processing, according to one embodiment, may add 12 bytes of C2 ECC to each 84-byte column of the Sub Data Set, as shown in Table 2.

TABLE 2

| | | | | C2 Encoded Sub Data Set | | | | | |
|---|---|---|---|---|---|---|---|---|---|
| | 0 | 1 | 2 | 3 | 4 | ... | 913 | 914 | 915 | 916 | 917 |
| 0 | 0 | 1 | 2 | 3 | 4 | ... | 913 | 914 | 915 | 916 | 917 |
| 1 | 918 | 919 | 920 | 921 | 922 | ... | 1831 | 1832 | 1833 | 1834 | 1835 |
| . | . | . | . | . | . | | . | . | . | . | . |
| . | . | . | . | . | . | | . | . | . | . | . |
| 82 | 75276 | 75277 | 75278 | 75279 | 75280 | ... | 76189 | 76190 | 76191 | 76192 | 76193 |
| 83 | 76194 | 76195 | 76196 | 76197 | 76198 | ... | 77107 | 77108 | 77109 | 77110 | 77111 |
| 84 | 77112 | 77113 | 77114 | 77115 | 77116 | ... | 78025 | 78026 | 78027 | 78028 | 78029 |
| . | . | . | . | . | . | | . | . | . | . | . |
| . | . | . | . | . | . | | . | . | . | . | . |
| 95 | 87210 | 87211 | 87212 | 87213 | 87214 | ... | 88123 | 88124 | 88125 | 88126 | 88127 |

A (96, 84, 13) Reed-Solomon code may be applied to each 84-byte column of the Sub Data Set matrix producing twelve C2 ECC bytes per column, according to one embodiment. The resulting 96×918 matrix of 88,128 bytes may be referred to as a C2 Encoded Sub Data Set.

The calculation in a GF (256) may be defined by Equation 1, in one approach.

$$P(x) = x^8 + x^4 + x^3 + x^2 + 1 \quad \text{Equation 1}$$

A primitive element α in GF (256) may be represented by Equation 2, in one approach.

$$\alpha = (00000010) \quad \text{Equation 2}$$

The generator polynomial may be represented by Equations 3 and 4, in one approach.

$$G(x) = (x + \alpha^{122})(x + \alpha^{123})(x + \alpha^{124}) \\ (x + \alpha^{125})(x + \alpha^{126})(x + \alpha^{127})(x + \alpha^{128})(x + \alpha^{128}) \\ (x + \alpha^{129})(x + \alpha^{130})(x + \alpha^{131})(x + \alpha^{132})(x + \alpha^{133}) \quad \text{Equation 3}$$

$$G(x) = \prod_{j=122}^{133} (x + \alpha^j) = \\ x^{12} + \alpha^{224}x^{11} + \alpha^{32}x^{10} + \alpha^{209}x^9 + \alpha^{99}x^8 + \alpha^{32}x^7 + \\ \alpha^{80}x^6 + \alpha^{32}x^5 + \alpha^{99}x^4 + \alpha^{209}x^3 + \alpha^{32}x^2 + \alpha^{224}x^1 + 1 \quad \text{Equation 4}$$

Figure 3:
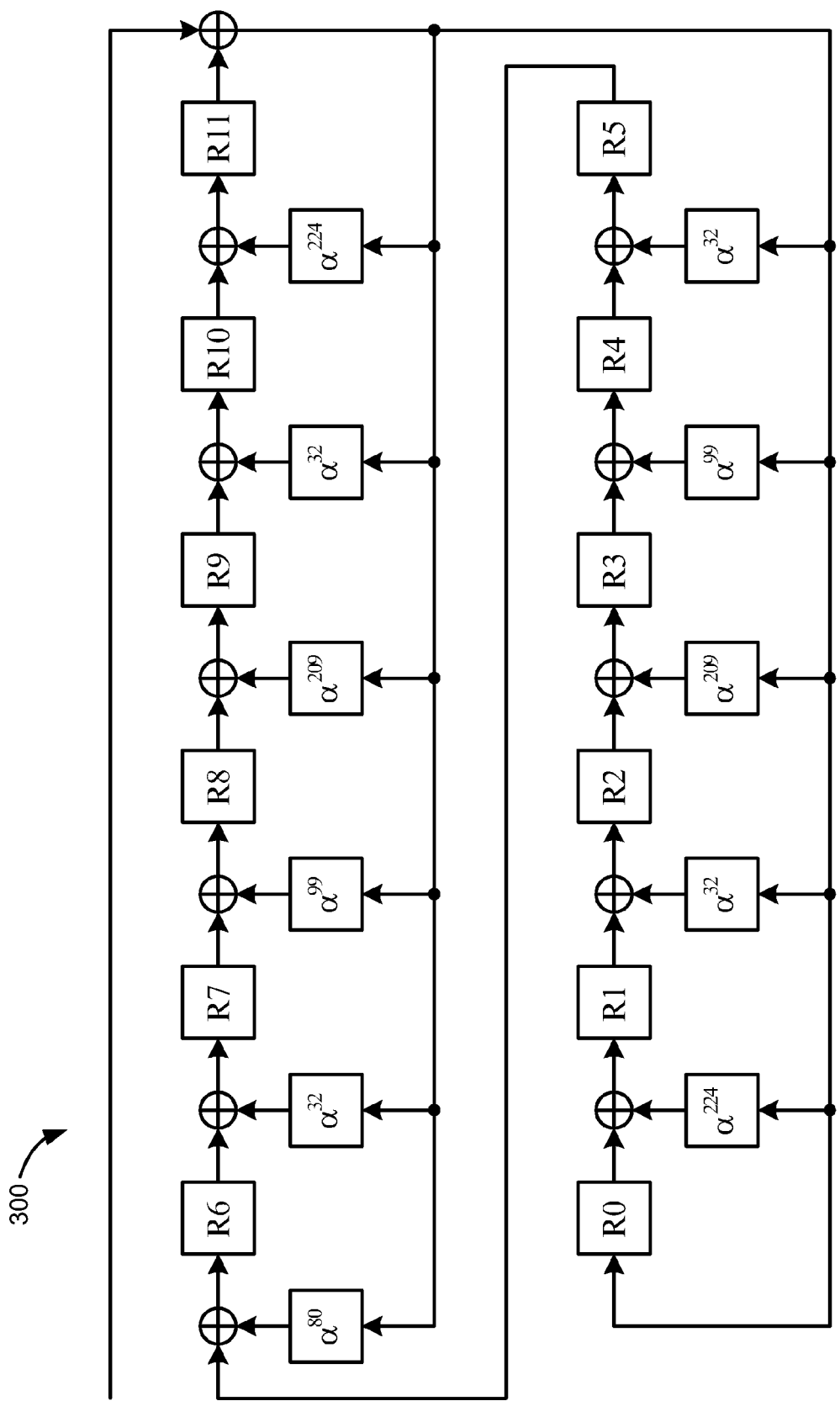
FIG. 3 shows a generator circuit for producing error correction code (ECC) bytes, according to one embodiment.

As shown in FIG. 3, according to one embodiment, the ECC bytes may be generated by processing the requisite bytes through a generator circuit 300. According to one approach, the generator circuit's registers, R0, R1, ..., R11, may be set to (00) prior to beginning the processing. The registers R0, R1, ..., R11, may be eight bits wide, according to one approach. Data bytes may be fed sequentially into the encoder. After the requisite bytes have been processed, the content of R11 may be set as ECC11, that of R10 may be set as ECC10, that of R9 may be set as ECC9, etc. When these ECC bytes are appended to data bytes, and/or placed into a field, ECC11 may be the first byte appended, followed by ECC10, ECC9, etc.

Referring again to FIG. 2, a Headerized Sub Data Set may be the result of concatenating a 10-byte header to each row of the C2 Encoded Sub Data Set, as shown in FIG. 2 as the insert headers module 212, which is then implemented in the tape layout. The processing may add 10 bytes of a Header to the beginning of each 918-byte row of the Sub Data Set, as shown in Table 3, according to one embodiment. The resulting Headerized Sub Data Set may be a 96×928 matrix of 89,088 bytes.

TABLE 3

| | | | Headerized Sub Data Set | | | | | | |
|---|---|---|---|---|---|---|---|---|---|
| | 0 | 1 | ... | 9 | 10 | ... | 923 | 924 | 925 | 926 | 927 |
| 0 | 0 | 1 | ... | 9 | 10 | ... | 923 | 924 | 925 | 926 | 927 |
| 1 | 928 | 929 | ... | 937 | 938 | ... | 1851 | 1852 | 1853 | 1854 | 1855 |
| . | . | . | | . | . | | . | . | . | . | . |
| . | . | . | | . | . | | . | . | . | . | . |
| 94 | 87232 | 87233 | ... | 87241 | 87242 | ... | 88155 | 88156 | 88157 | 88158 | 88159 |
| 95 | 88160 | 88161 | ... | 88169 | 88170 | ... | 89083 | 89084 | 89085 | 89086 | 89087 |

Each row of the Headerized Sub Data Set may be passed through a randomizer 204 in FIG. 2, a modulation encoder 206, then C1 encoding 208 (preferably LDPC coding), and then format features may be inserted in module 210. The row element is the basic unit for processing and is referred to as CW-4 herein (this identifier will become more apparent after the discussion of the LDPC C1 ECC).

The modulation encoder 206 may be implemented according to various embodiments, described herein and otherwise, as would be understood by one of skill in the art upon reading the present descriptions. One embodiment of the modulation encoder 206 is described in FIGS. 7A-7B, described in more detail later.

In addition, the modulation encoder may operate according to PRML(G,I,M) codes, which are described in U.S. Pat. No. 7,616,134, issued on Nov. 10, 2009, which is hereby incorporated in its entirety by reference.

Referring again to FIG. 2, the C1 encoding 208 may be a LDPC encoding in one approach, and the modulation code used by the modulation encoder 206 may be the reverse concatenated code. The format features 210 are states or hard features that are added to the data to make it easier to identify a position on the magnetic tape. These format features may include, but are not limited to, a DSS which is a periodic pattern of period 12 that has a '1' followed by 11 '0's', variable-frequency oscillator (VFO) fields to lock PLLs and synchronize characters, etc.

Once the modulation code is added in module 206, the sub-dataset is encoded with C1 code in module 208, which is a LDPC code in one approach. Accordingly, in partial reverse concatenation, the data flow is encoded with a C2 encoder, then with a modulation code, and then with a C1 encoder.

A 10-byte CW-4 Header may prefix each CW-4 and may include the information as shown in Table 3, according to one approach. This information may include a CW-4 identifier, write pass, and header parity for ECC.

TABLE 4

CW-4 Header

| Byte Positions | Length in Bytes | Name of the Field |
|---|---|---|
| 0 | 4 | CW-4 Identifier |
| 4 | 4 | Write Pass |
| 8 | 2 | Header Parity |

Table 5 shows the CW-4 identifier, according to one approach. Byte 0 bit 7 may be an Amble Flag (AF), in one approach. The AF may be set to ONE if the Designated CW-4 is an Amble Designated CW-4, and ZERO if the Designated CW-4 is a Data Designated CW-4.

TABLE 5

CW-4 Identifier

| Byte 0 | | | | | | | | Byte 1 | | | | | | | |
|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 |
| AF | AWT | | Data Set ID Fragment | | | | | | | | ACN | | | | |

| Byte 2 | | | | | | | | Byte 3 | | | | | | | |
|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 |
| ACN (cont.) | | | | | | | | CW-4 Designation | | | | | | | |

Byte 0 bit 6 may be an Adjacent Wrap Toggle (AWT), in one approach. The AWT may be set to the second least significant bit of the wrap number, e.g., ZERO for wraps 0 and 1, and ONE for wraps 2 and 3. Byte 0 bits 5-0 may be Data Set ID Fragments, in one approach. The Data Set ID Fragments may include the six least significant bits of the Data Set number. Byte 1 and Byte 2, bits 7-5 may include the 11-bit Absolute Codeword Object Set Sequence Number (ACN), in one approach. Byte 2, bits 4-0, and Byte 3 may be designated based on whether the Designated CW-4 is an Amble Designated CW-4, in which case these bits may all be set to ZEROS, or not an Amble Designated CW-4, in which case these bits may be set to a 13-bit value of the CW-4 Designation, according to one approach.

The ACN may be set between 0 and 2047 for each Codeword Object Set. This number may be one greater than the ACN of the Codeword Object Set written immediately before it on tape, or may be ZERO if the previously written ACN is 2047, in one approach. The ACN may be the same in all CW-4 Headers in the Codeword Object Set, in one embodiment. Also, the ACN of the first Codeword Object Set written on a wrap may be ZERO, according to a preferred embodiment.

When appending to the magnetic tape, the ACN of the first Codeword Object Set written at the append point may be between 1 and 256 greater mod(2048) than the last Codeword Object Set written in the Data Set before the append point, in one embodiment.

The Write Pass Identifier field may identify the write pass on which the Data Set was written. The content of this field may be the same as the Tape Write Pass value in the Data Set Identification Table (DSIT) for the Data Set to which the CW-4s belong, except following an Interrupted Data Set, according to one embodiment.

The Header Parity may be a Reed-Solomon code over GF (256), or any other suitable code known in the art. The calculation in a GF (256) may be defined by Equation 5, in one approach.

$$P(x) = x^8 + x^4 + x^3 + x^2 + 1 \quad \text{Equation 5}$$

A primitive element α in GF (256) may be set according to Equation 6, in one approach.

$$\alpha = (00000010) \quad \text{Equation 6}$$

The generator polynomial may be set according to Equation 7, in one approach.

$$G(x) = (x + \alpha^{127})(x + \alpha^{128}) = x^2 + \alpha^{152}x + 1 \quad \text{Equation 7}$$

Figure 4:
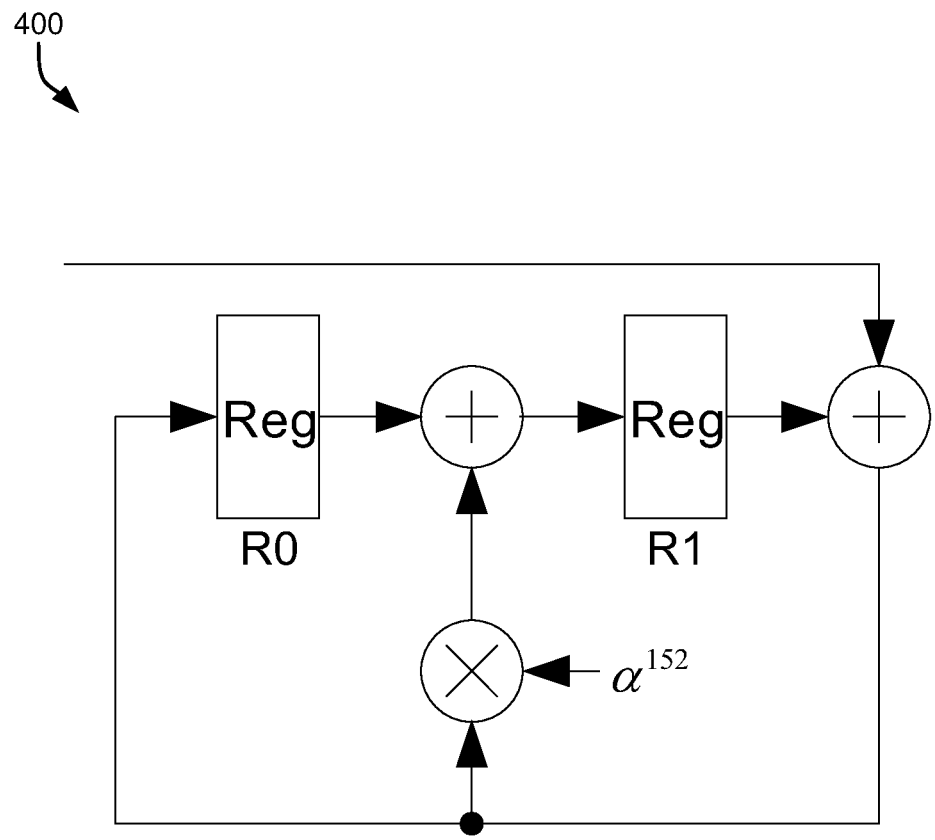
FIG. 4 shows a generator circuit for producing cyclic redundancy check (CRC) bytes, according to one embodiment.

Referring now to FIG. 4, the cyclic redundancy check (CRC) bytes may be generated by processing the requisite bytes through a generator circuit 400 whose registers R0, R1 may be set to (00) prior to beginning the processing. Registers R0 and R1 may be 8 bits wide in one embodiment. Data bytes may be fed sequentially into the encoder. After the requisite bytes have been processed, the content of R1 may be CRC1 and that of R0 may be CRC0, in one approach. CRC1 may be the first byte in the header, and CRC0 may be the second byte in the header, in preferred embodiments.

Each CW-4 from the Headerized Sub Data Set may be passed through a randomizer 204 in FIG. 2, thereby creating the Randomized Sub Data Set, in one embodiment. The randomizer is included because in some cases, repetitive patterns may cause issues in the tape drive. The randomizer ensures that bits do not repeat for too long, thereby ensuring there will be no issues in this regard in the tape drive.

The processing will not add any additional bytes to the Headerized Sub Data Set. The resulting Randomized Sub Data Set may be a 96×928 matrix of 89,088 bytes, as shown in Table 6, according to one embodiment.

TABLE 6

| | Randomized Sub Data Set | | | | | | | | | |
|---|---|---|---|---|---|---|---|---|---|---|
| | 0 | 1 | ... | 9 | 10 | ... | 923 | 924 | 925 | 926 | 927 |
| 0 | 0 | 1 | ... | 9 | 10 | ... | 923 | 924 | 925 | 926 | 927 |
| 1 | 928 | 929 | ... | 937 | 938 | ... | 1851 | 1852 | 1853 | 1854 | 1855 |
| . | . | . | . | . | . | . | . | . | . | . | . |
| . | . | . | . | . | . | . | . | . | . | . | . |
| . | . | . | . | . | . | . | . | . | . | . | . |
| 94 | 87232 | 87233 | ... | 87241 | 87242 | ... | 88155 | 88156 | 88157 | 88158 | 88159 |
| 95 | 88160 | 88161 | ... | 88169 | 88170 | ... | 89083 | 89084 | 89085 | 89086 | 89087 |

Figure 5:
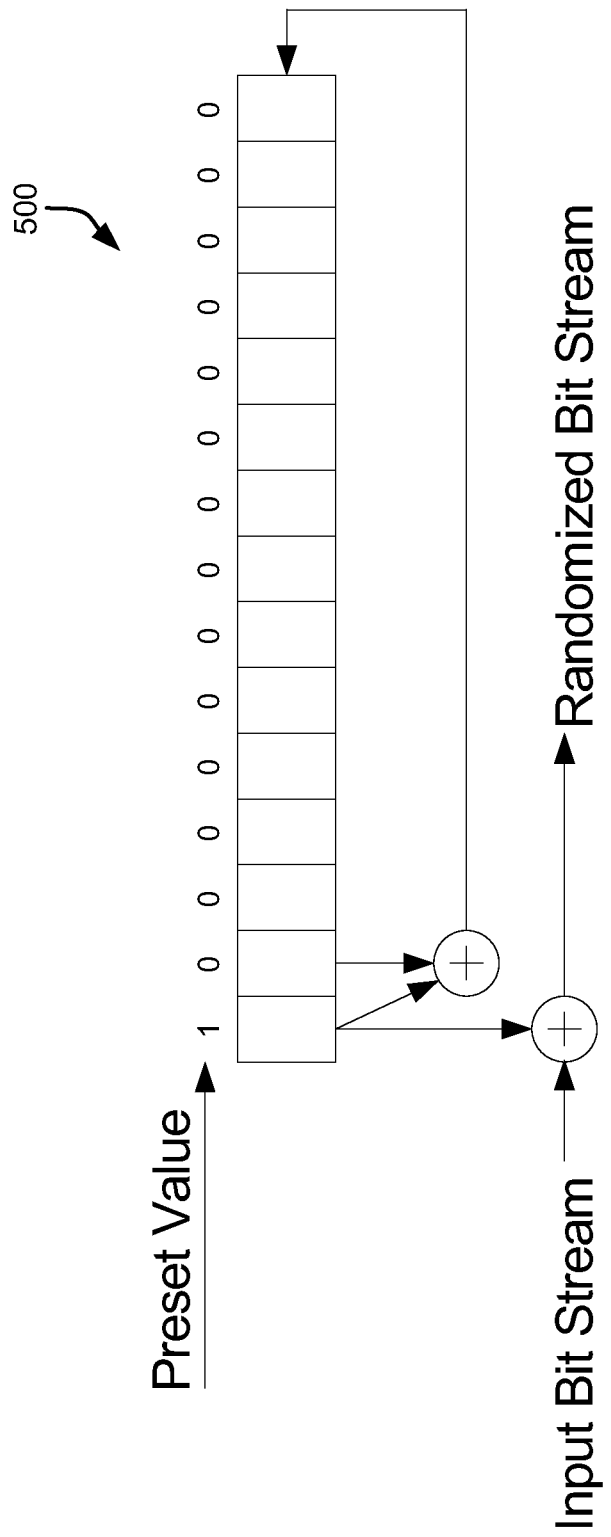
FIG. 5 shows a randomizer circuit, according to one embodiment.

The randomization algorithm may be preset at the beginning of every CW-4 Header, in one approach, or may be set according to some other rationale known in the art. FIG. 5 shows a randomization shift register 500, according to one embodiment. For each byte of the CW-4 Header and data, the most significant bit, e.g., bit 7, is input first. Then, each successive bit is input. The logical operators are Exclusive OR's. The result of this operation is a randomized bit stream, as shown in FIG. 5.

Each CW-4 from the Randomized Sub Data Set is passed through an encoder, such as the modulation module 206 in FIG. 2. The encoder may be for a (234, 232) modulation code satisfying the constraints (G=12, I=6, M=22), in one approach. This extends the length of each CW-4 from 928 bytes to 936 bytes, according to one embodiment. Thus, the Modulated Sub Data Set may be a 96×936 matrix of 89,856 bytes, according to one approach. The binary output of the modulation encoder is referred to as modulation-encoded bits.

Each CW-4 from the Modulated Sub Data Set is then passed through an encoder for a (1992, 1872) LDPC code, such as the LDPC encoding module 208 shown in FIG. 2. There are 234 information bytes per LDPC codeword and each CW-4 of the C1 Sub Data Set may include four LDPC codewords. Since the modulation code has been added prior to LDPC encoding, four LDPC codewords may be concatenated to form the CW-4 (note that in conventional drives, the C1 codewords are interleaved). The constraints satisfied by the modulated and C1 encoded sequences recorded on tape may be (G=14, I=7, M=24), in one approach. C1 encoding extends the length of each CW-4 of the Modulated Sub Data Set from 936 bytes to 996 bytes. Thus, the C1 Sub Data Set may be a 96×996 byte matrix of 95,616 bytes.

The input to the LDPC encoder 208 may be the bits that are output from the modulation encoder 206. These bits may occur in blocks of 234 bits. Eight blocks of modulation encoded data bits may be concatenated to form the input to the LDPC encoder 208. Each block of 234 bytes (1872 bits) as input to the LDPC encoder 208 may be referred to as a modulation-encoded block.

The C1 code may be an LDPC code, in preferred embodiments, that is typically described by an H-matrix. A simple example of the notation used for the LDPC encoder appears below for a small H-matrix, which may be enlarged to any sized LDPC encoding scheme, as would be understood by one of skill in the art. The H-Matrix for an LDPC code is a sparse, binary matrix of 1 and 0 entries. The example H-Matrix shown below is for an M×N parity check matrix, where M=9 (check node) and N=12 (symbol node). For this example, each check node has four 1 and eight 0 entries—i.e., ⅔ of the matrix is filled with 0 entries.

$$H = \begin{bmatrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 1 & 0 & 0 & 0 & 1 & 1 & 0 & 0 & 1 & 0 & 0 \\ 1 & 0 & 1 & 0 & 0 & 0 & 0 & 1 & 0 & 0 & 1 & 0 \\ 0 & 0 & 0 & 1 & 1 & 0 & 0 & 0 & 1 & 0 & 0 & 1 \\ 1 & 0 & 0 & 1 & 1 & 0 & 1 & 0 & 0 & 0 & 0 & 0 \\ 0 & 0 & 0 & 0 & 0 & 1 & 0 & 1 & 0 & 0 & 1 & 1 \\ 0 & 1 & 1 & 0 & 0 & 0 & 0 & 1 & 1 & 0 & 0 & 0 \end{bmatrix}$$

Example H-Matrix

The example H-matrix may be represented by the connectivity matrix shown below, according to one embodiment. In this connectivity matrix, each check node is listed in the left column starting with index 0 (the top row of the H-matrix). The location of each 1 entry within the check node of the H-matrix is given in the corresponding row of the connectivity matrix, again starting with bit index 0 being the left column.

| Check-Node # | Symbol-Node Indices | | | |
|---|---|---|---|---|
| 0 | 2 | 5 | 6 | 7 |
| 1 | 0 | 1 | 4 | 11 |
| 2 | 3 | 8 | 9 | 10 |
| 3 | 1 | 5 | 6 | 9 |
| 4 | 0 | 2 | 7 | 10 |
| 5 | 3 | 4 | 8 | 11 |
| 6 | 0 | 3 | 4 | 6 |
| 7 | 5 | 7 | 10 | 11 |
| 8 | 1 | 2 | 8 | 9 |

Simple Example of a Check-Node Connectivity Matrix

The systematic H-Matrix for a LDPC code, according to one embodiment, may have 120 check-nodes (M=120) and 1992 symbol nodes (N=1992). This creates 120 parity bits which normally may be concatenated to the end of the modulation-encoded block. However, since the data has been modulation encoded, this is not acceptable. Having 120 parity bits at the end of the 1872 bit modulation-encoded block would destroy the properties of the modulation code, as would be done in the conventional art. In order to avoid this problem, the parity bits are interspersed within the modulation-encoded bits. This does slightly weaken the properties of the modulation code, but the overall properties of the modulation code are still strong. With the parity insertion scheme shown in Table 7 below, the original modulation constraints (G=12, I=6, M=22) are weakened to (G=14, I=7, M=24).

Of course, any number of check-nodes and symbol nodes may be used according to user requirements, design criteria, tape capability, etc.

Instead of concatenation, the LDPC parity bits may be inserted within the modulation-encoded bits. In one embodiment, the encoding process begins by extending the modulation-encoded block from 1872 bits to 1992 bits by adding 120 bits. The 120 bits are initially set to '0' and pairs are interspersed in the modulation-encoded block between groups of 30 modulation-encoded bits. The LDPC encoder takes this input and calculates the parity bits, filling in the 120 bit locations that were initially set to '0'.

The creation of the input codeword and subsequent filling with parity check bits to create a LDPC codeword is shown in Table 7, according to one embodiment.

TABLE 7

Insertion of LDPC Parity Bits

| LDPC Codeword Bits | Source |
|---|---|
| 0-29 | Modulation-encoded bits 0-29 |
| 30-31 | Parity check bits from check-node 119 and 118 |
| 32-61 | Modulation-encoded bits 30-59 |
| 62-63 | Parity check bits from check-node 117 and 116 |
| 64-93 | Modulation-encoded bits 60-89 |
| 94-95 | Parity check bits from check-node 115 and 114 |
| . | . |
| . | . |
| . | . |
| 1888-1917 | Modulation-encoded bits 1770-1799 |
| 1918-1919 | Parity check bits from check-node 1 and 0 |
| 1920-1991 | Modulation-encoded bits 1800-1871 |

Figure 6B:
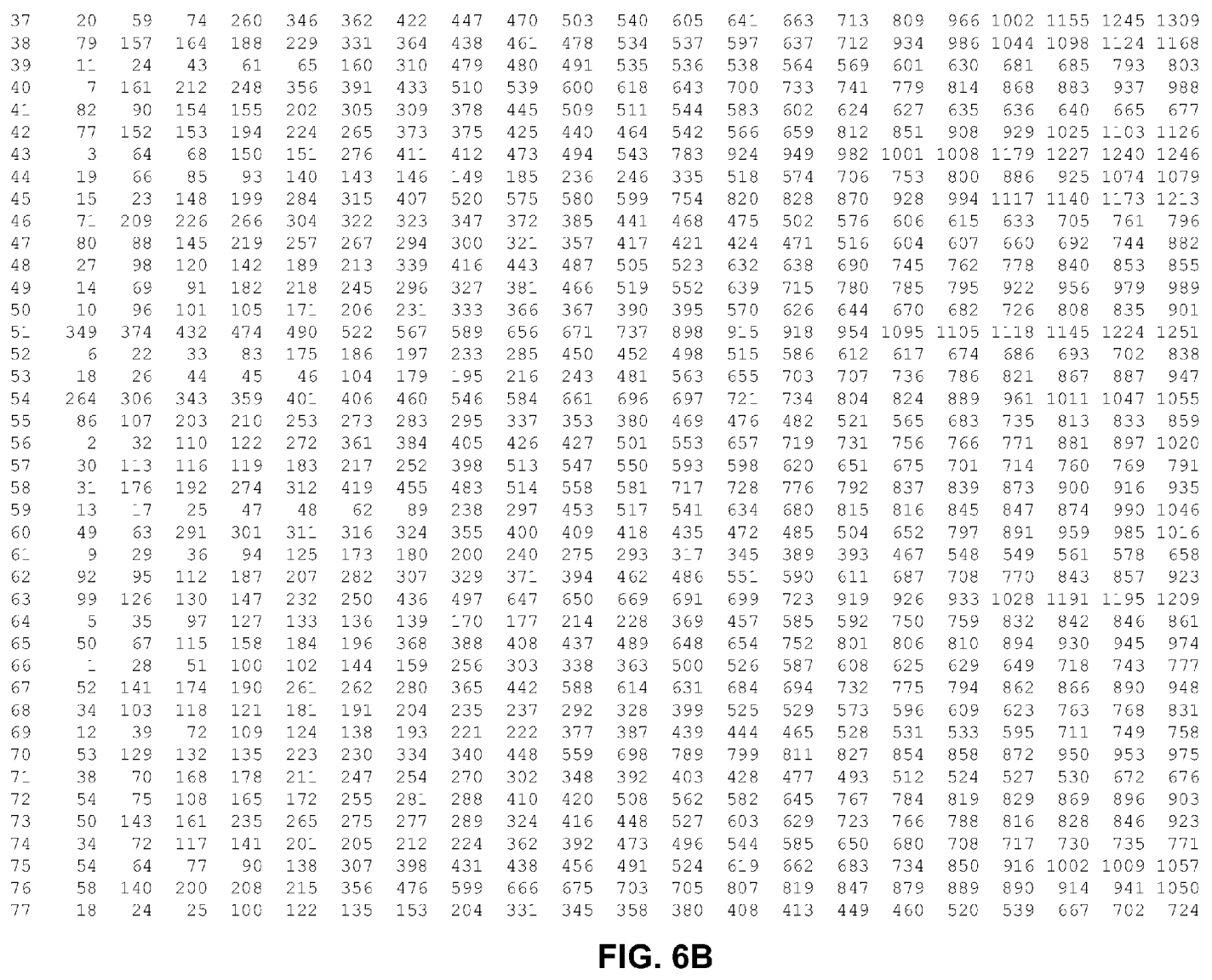
Figure 6C:
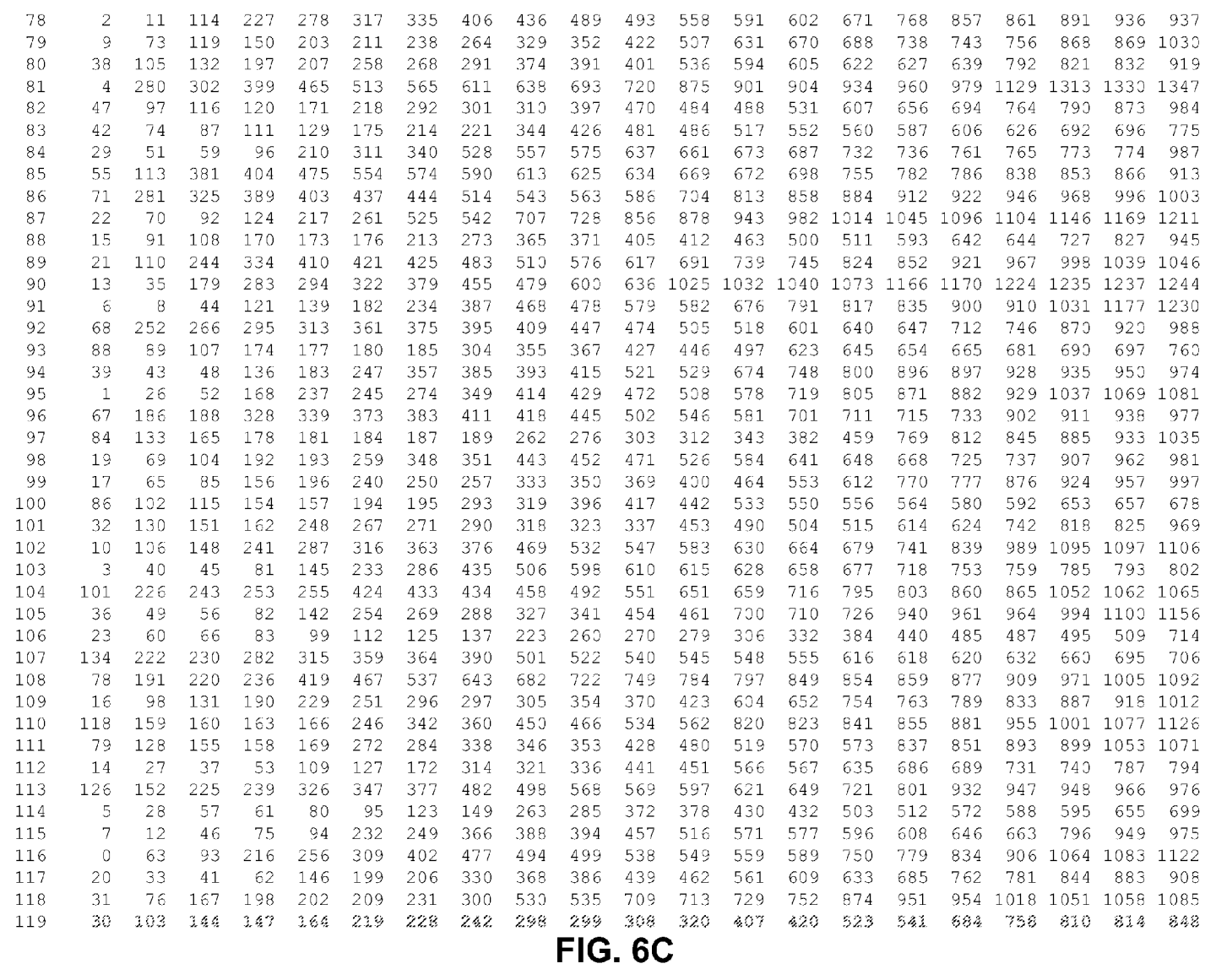
Figure 6D:
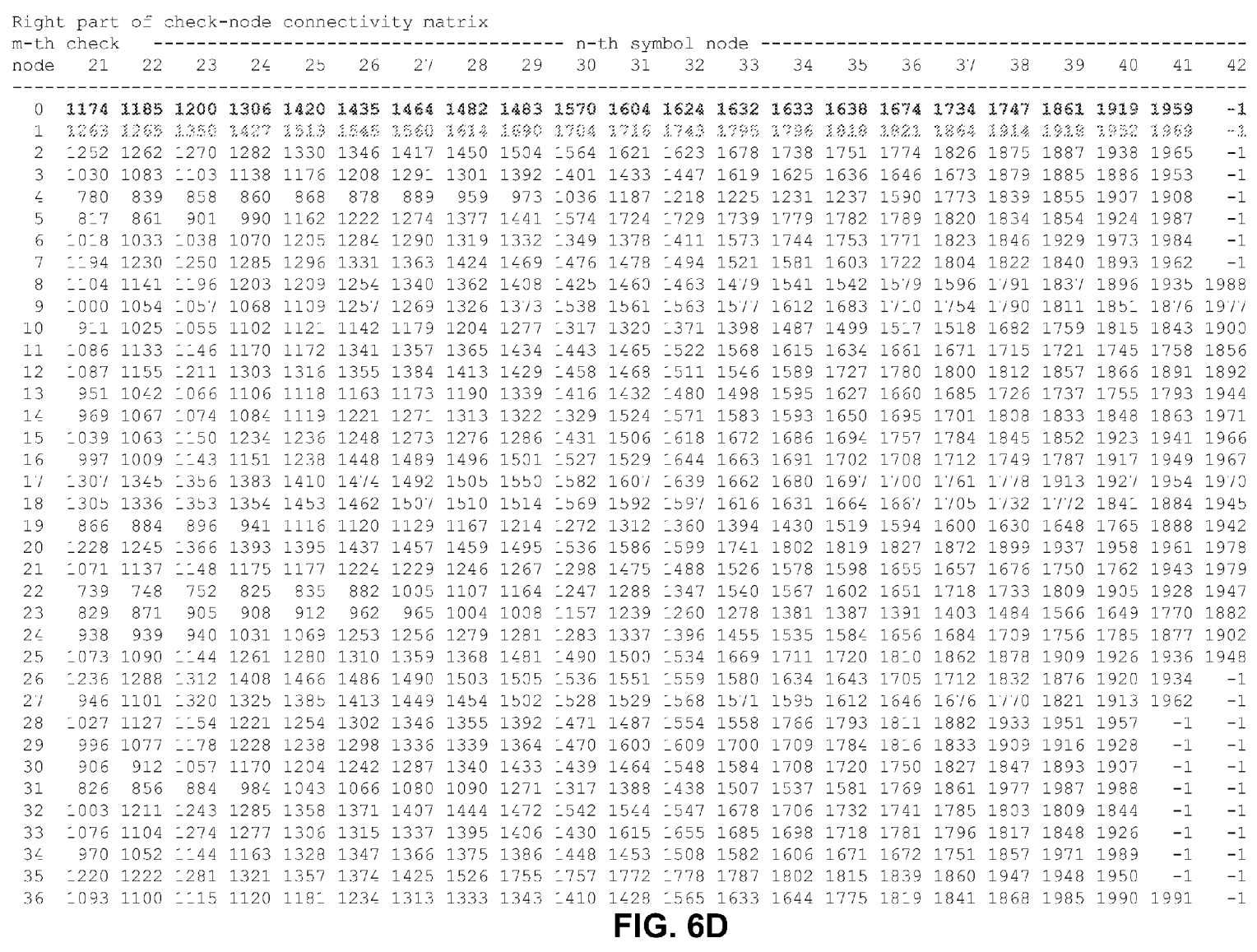
Figure 6E:
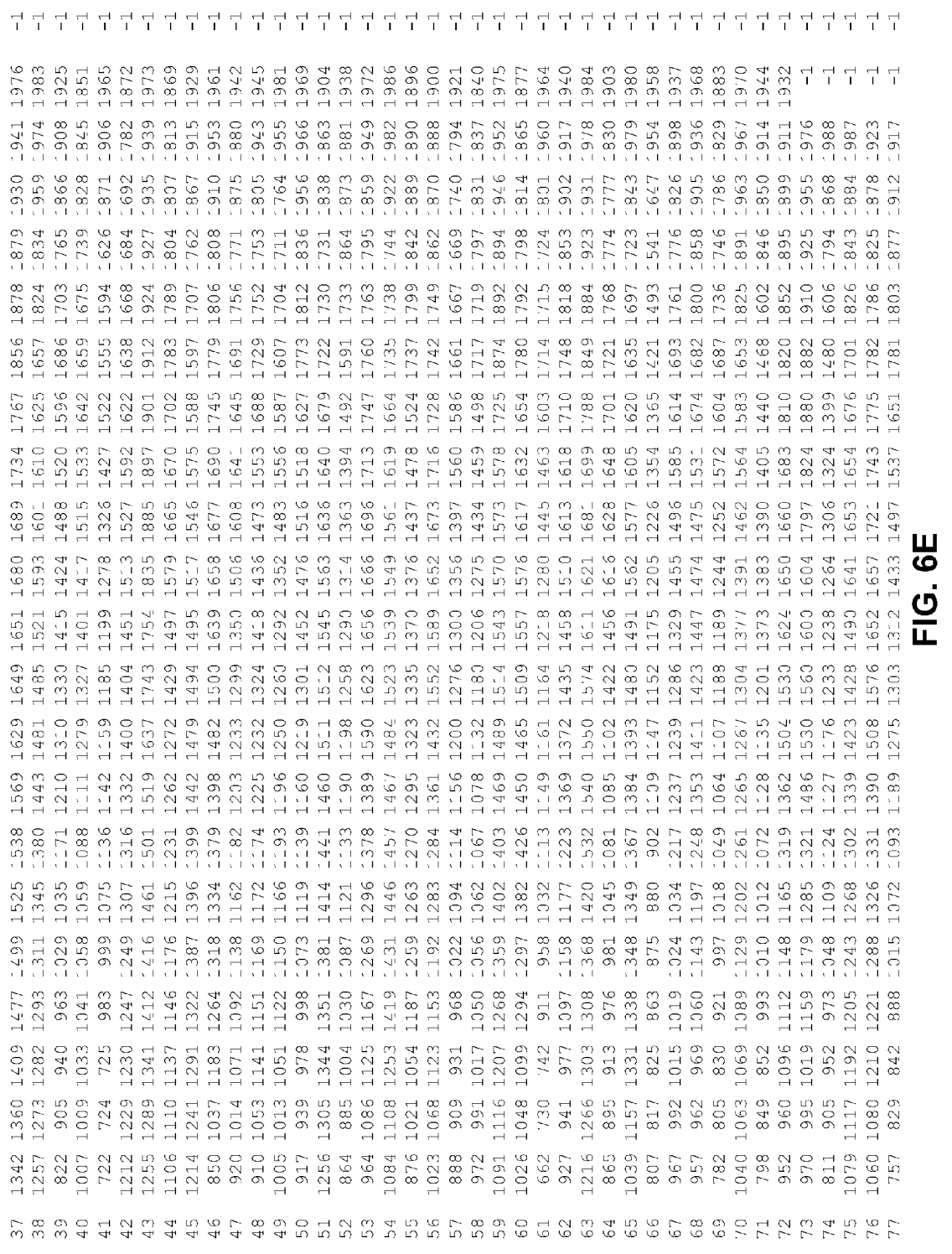
Figure 6F:
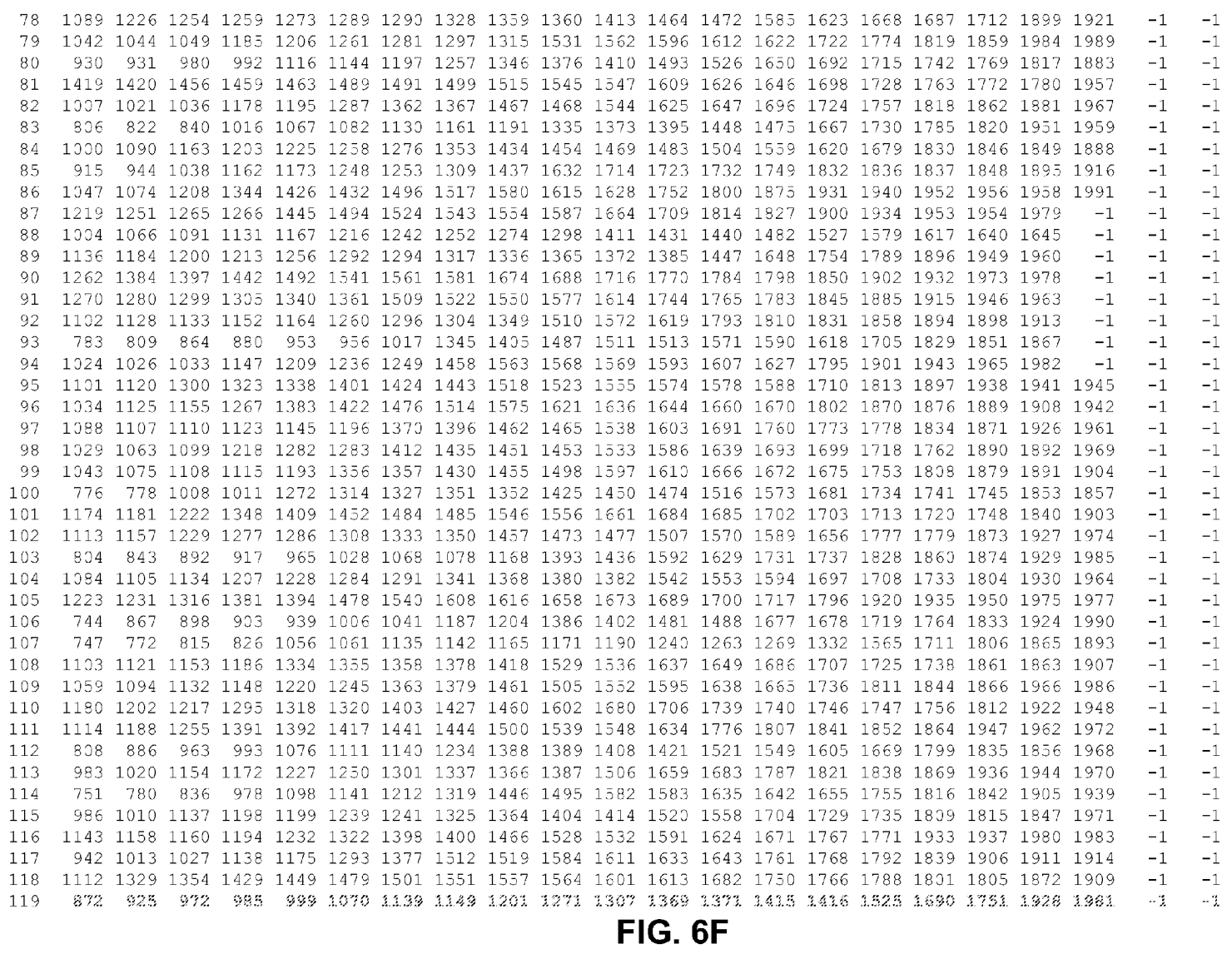

After the parity-check bit locations are created and filled with 0 entries, the parity check bits are created by using the H-matrix, an example of which is shown in FIGS. 6A-6F (where −1 indicates a no-connect), with FIGS. 6A-6C being for the left part of the check-node connectivity matrix, and FIGS. 6D-6F being for the right part of the check-node connectivity matrix. The process begins by calculating check-node 119 which is placed at bit 30 of the LDPC codeword. Next, check-node 118 is calculated and placed at bit 31. This continues until all the parity-check bits are calculated and placed in the LDPC codeword.

An ECC Encoded Data Set may include 6,119,424 bytes having sixty-four 96×996-byte C1 Encoded Sub Data Sets. Each row of each C1 Encoded Sub Data Set may be a 996-byte C1 Encoded CW-4. Thus, according to one embodiment, there may be 6,144 C1 Encoded CW-4s per ECC Encoded Data Set.

Table 8 shows how the designations for the 6,144 CW-4s may be allocated from the sixty-four C1 Sub Data Sets and the row number within the C1 Sub Data Set, in one example.

TABLE 8

| Row within | CW-4 Designation Sub Data Set Number | | | | | | | | | | | | | | | |
|---|---|---|---|---|---|---|---|---|---|---|---|---|---|---|---|---|
| Sub Data Set | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 32 | 33 | 34 | 35 | 36 | 37 | 38 | 38 | 40 | 41 | 42 | 43 | 44 | 45 | 46 | 47 |
| 2 | 64 | 65 | 66 | 67 | 68 | 69 | 70 | 71 | 72 | 73 | 74 | 75 | 76 | 77 | 78 | 79 |
| . | . | . | . | . | . | . | . | . | . | . | . | . | . | . | . | . |
| . | . | . | . | . | . | . | . | . | . | . | . | . | . | . | . | . |
| . | . | . | . | . | . | . | . | . | . | . | . | . | . | . | . | . |
| 93 | 5952 | 5953 | 5954 | 5955 | 5956 | 5957 | 5958 | 5959 | 5960 | 5961 | 5962 | 5963 | 5964 | 5965 | 5966 | 5967 |
| 94 | 6016 | 6017 | 6018 | 6019 | 6020 | 6021 | 6022 | 6023 | 6024 | 6025 | 6026 | 6027 | 6028 | 6029 | 6030 | 6031 |
| 95 | 6080 | 6081 | 6082 | 6083 | 6084 | 6085 | 6086 | 6087 | 6088 | 6089 | 6090 | 6091 | 6092 | 6093 | 6094 | 6095 |

TABLE 8-continued

CW-4 Designation

| Row within Sub Data Set | Sub Data Set Number | | | | | | | | | | | | | | | |
|---|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 | 31 |
| 0 | 16 | 17 | 18 | 19 | 20 | 21 | 22 | 23 | 24 | 25 | 26 | 27 | 28 | 29 | 30 | 31 |
| 1 | 80 | 81 | 82 | 83 | 84 | 85 | 86 | 87 | 88 | 89 | 90 | 91 | 92 | 93 | 94 | 95 |
| 2 | 144 | 145 | 146 | 147 | 148 | 149 | 150 | 151 | 152 | 153 | 154 | 155 | 156 | 157 | 158 | 159 |
| . | . | . | . | . | . | . | . | . | . | . | . | . | . | . | . | . |
| . | . | . | . | . | . | . | . | . | . | . | . | . | . | . | . | . |
| . | . | . | . | . | . | . | . | . | . | . | . | . | . | . | . | . |
| 93 | 5968 | 5969 | 5970 | 5971 | 5972 | 5973 | 5974 | 5975 | 5976 | 5977 | 5978 | 5979 | 5980 | 5981 | 5982 | 5983 |
| 94 | 6032 | 6033 | 6034 | 6035 | 6036 | 6037 | 6038 | 6039 | 6040 | 6041 | 6042 | 6043 | 6044 | 6045 | 6046 | 6047 |
| 95 | 6096 | 6097 | 6098 | 6099 | 6100 | 6101 | 6102 | 6103 | 6104 | 6105 | 6106 | 6107 | 6108 | 6109 | 6110 | 6111 |

| Row within Sub Data Set | Sub Data Set Number | | | | | | | | | | | | | | | |
|---|---|---|---|---|---|---|---|---|---|---|---|---|---|---|---|---|
| | 32 | 33 | 34 | 35 | 36 | 37 | 38 | 39 | 40 | 41 | 42 | 43 | 44 | 45 | 46 | 47 |
| 0 | 32 | 33 | 34 | 35 | 36 | 37 | 38 | 39 | 40 | 41 | 42 | 43 | 44 | 45 | 46 | 47 |
| 1 | 96 | 97 | 98 | 99 | 100 | 101 | 102 | 103 | 104 | 105 | 106 | 107 | 108 | 109 | 110 | 111 |
| 2 | 160 | 161 | 162 | 163 | 164 | 165 | 166 | 167 | 168 | 169 | 170 | 171 | 172 | 173 | 174 | 175 |
| . | . | . | . | . | . | . | . | . | . | . | . | . | . | . | . | . |
| . | . | . | . | . | . | . | . | . | . | . | . | . | . | . | . | . |
| . | . | . | . | . | . | . | . | . | . | . | . | . | . | . | . | . |
| 93 | 5984 | 5985 | 5986 | 5987 | 5988 | 5989 | 5990 | 5991 | 5992 | 5993 | 5994 | 5995 | 5996 | 5997 | 5998 | 5999 |
| 94 | 6048 | 6049 | 6050 | 6051 | 6052 | 6053 | 6054 | 6055 | 6056 | 6057 | 6058 | 6059 | 6060 | 6061 | 6062 | 6063 |
| 95 | 6112 | 6113 | 6114 | 6115 | 6116 | 6117 | 6118 | 6119 | 6120 | 6121 | 6122 | 6123 | 6124 | 6125 | 6126 | 6127 |

| Row within Sub Data Set | Sub Data Set Number | | | | | | | | | | | | | | | |
|---|---|---|---|---|---|---|---|---|---|---|---|---|---|---|---|---|
| | 48 | 49 | 50 | 51 | 52 | 53 | 54 | 55 | 56 | 57 | 58 | 59 | 60 | 61 | 62 | 63 |
| 0 | 48 | 49 | 50 | 51 | 52 | 53 | 54 | 55 | 56 | 57 | 58 | 59 | 60 | 61 | 62 | 63 |
| 1 | 112 | 113 | 114 | 115 | 116 | 117 | 118 | 119 | 120 | 121 | 122 | 123 | 124 | 125 | 126 | 127 |
| 2 | 176 | 177 | 178 | 179 | 180 | 181 | 182 | 183 | 184 | 185 | 186 | 187 | 188 | 189 | 190 | 191 |
| . | . | . | . | . | . | . | . | . | . | . | . | . | . | . | . | . |
| . | . | . | . | . | . | . | . | . | . | . | . | . | . | . | . | . |
| . | . | . | . | . | . | . | . | . | . | . | . | . | . | . | . | . |
| 93 | 6000 | 6001 | 6002 | 6003 | 6004 | 6005 | 6006 | 6007 | 6008 | 6009 | 6010 | 6011 | 6012 | 6013 | 6014 | 6015 |
| 94 | 6064 | 6065 | 6066 | 6067 | 6068 | 6069 | 6070 | 6071 | 6072 | 6073 | 6074 | 6075 | 6076 | 6077 | 6078 | 6079 |
| 95 | 6128 | 6129 | 6130 | 6131 | 6132 | 6133 | 6134 | 6135 | 6136 | 6137 | 6138 | 6139 | 6140 | 6141 | 6142 | 6143 |

Designated CW-4s may be written simultaneously onto the magnetic tape in sets of thirty-two Designated CW-4s thereby forming a CW-4 Set, where 32 is the number of concurrent active tracks. Of course, more or less tracks may exist on the magnetic tape, in which case the numbers described herein may be altered accordingly, as would be understood by one of skill in the art upon reading the present descriptions. One Designated CW-4 of each set may be written to each of the 32 tracks. Tracks may be numbered 0 to 31, where Logical Tracks 0 to 31 correspond to the physical tracks that are defined to be in the current wrap, in numerically ascending order. Logical Track 0 may correspond to the lowest numbered physical track in the set. Logical Track 31 may correspond to the highest numbered physical track in the set. CW-4 Sets may be numbered 0 to 191. A Codeword Object Set (CO Set) comprises two CW-4 Sets, in one approach.

The CW-4 Set and track number to which a Designated CW-4 is allocated may be defined according to Table 9 and Table 10, in one approach. Note that the cells doubly outlined indicate the location of the C1 Codeword Symbols from Sub Data Sets 0 and 1. This illustrates the way in which the C1 Codeword is spread across all tracks. The ordering of the CW-4 Sets within a CO Set is periodically reversed, in one approach. See CW-4 Sets 64/65, 128/129, etc.

Note that the entry at CW-4 set number i and track number t is given by Equation 8.

$$CWI\_table(i,t) = floor(i/2)*64 + mod(mod(i,2) + mod(floor(i/96),2),2) + mod(floor(i/2)*(-15) + t, 32)*2 \quad \text{Equation 8}$$

TABLE 9

Allocation of CW-4s to Logical Tracks

| Track Number | CW-4 Set | | | | | | |
|---|---|---|---|---|---|---|---|
| | 0 | 1 | 2 | 3 | 4 | 5 | ... |
| 0 | 0 | 1 | 98 | 99 | 132 | 133 | ... |
| 1 | 2 | 3 | 100 | 101 | 134 | 135 | ... |
| 2 | 4 | 5 | 102 | 103 | 136 | 137 | ... |
| 3 | 6 | 7 | 104 | 105 | 138 | 139 | ... |
| 4 | 8 | 9 | 106 | 107 | 140 | 141 | ... |
| 5 | 10 | 11 | 108 | 109 | 142 | 143 | ... |
| 6 | 12 | 13 | 110 | 111 | 144 | 145 | ... |
| 7 | 14 | 15 | 112 | 113 | 146 | 147 | ... |
| 8 | 16 | 17 | 114 | 115 | 148 | 149 | ... |
| 9 | 18 | 19 | 116 | 117 | 150 | 151 | ... |
| 10 | 20 | 21 | 118 | 119 | 152 | 153 | ... |
| 11 | 22 | 23 | 120 | 121 | 154 | 155 | ... |
| 12 | 24 | 25 | 122 | 123 | 156 | 157 | ... |
| 13 | 26 | 27 | 124 | 125 | 158 | 159 | ... |
| 14 | 28 | 29 | 126 | 127 | 160 | 161 | ... |
| 15 | 30 | 31 | 64 | 65 | 162 | 163 | ... |
| 16 | 32 | 33 | 66 | 67 | 164 | 165 | ... |
| 17 | 34 | 35 | 68 | 69 | 166 | 167 | ... |
| 18 | 36 | 37 | 70 | 71 | 168 | 169 | ... |
| 19 | 38 | 39 | 72 | 73 | 170 | 171 | ... |
| 20 | 40 | 41 | 74 | 75 | 172 | 173 | ... |
| 21 | 42 | 43 | 76 | 77 | 174 | 175 | ... |
| 22 | 44 | 45 | 78 | 79 | 176 | 177 | ... |
| 23 | 46 | 47 | 80 | 81 | 178 | 179 | ... |
| 24 | 48 | 49 | 82 | 83 | 180 | 181 | ... |
| 25 | 50 | 51 | 84 | 85 | 182 | 183 | ... |
| 26 | 52 | 53 | 86 | 87 | 184 | 185 | ... |
| 27 | 54 | 55 | 88 | 89 | 186 | 187 | ... |
| 28 | 56 | 57 | 90 | 91 | 188 | 189 | ... |
| 29 | 58 | 59 | 92 | 93 | 190 | 191 | ... |
| 30 | 60 | 61 | 94 | 95 | 128 | 129 | ... |
| 31 | 62 | 63 | 96 | 97 | 130 | 131 | ... |
| | 0 | | 1 | | 2 | | ... |
| | Codeword Object Set | | | | | | |

TABLE 10

Allocation of CW-4s to Logical Tracks

| Track Number | CW-4 Set | | | | | | |
|---|---|---|---|---|---|---|---|
| | ... | 186 | 187 | 188 | 189 | 190 | 191 |
| 0 | ... | 5979 | 5978 | 6077 | 6076 | 6111 | 6110 |
| 1 | ... | 5981 | 5980 | 6079 | 6078 | 6113 | 6112 |
| 2 | ... | 5983 | 5982 | 6017 | 6016 | 6115 | 6114 |
| 3 | ... | 5985 | 5984 | 6019 | 6018 | 6117 | 6116 |
| 4 | ... | 5987 | 5986 | 6021 | 6020 | 6119 | 6118 |
| 5 | ... | 5989 | 5988 | 6023 | 6022 | 6121 | 6120 |
| 6 | ... | 5991 | 5990 | 6025 | 6024 | 6123 | 6122 |
| 7 | ... | 5993 | 5992 | 6027 | 6026 | 6125 | 6124 |
| 8 | ... | 5995 | 5994 | 6029 | 6028 | 6127 | 6126 |
| 9 | ... | 5997 | 5996 | 6031 | 6030 | 6129 | 6128 |
| 10 | ... | 5999 | 5998 | 6033 | 6032 | 6131 | 6130 |
| 11 | ... | 6001 | 6000 | 6035 | 6034 | 6133 | 6132 |
| 12 | ... | 6003 | 6002 | 6037 | 6036 | 6135 | 6134 |
| 13 | ... | 6005 | 6004 | 6039 | 6038 | 6137 | 6136 |
| 14 | ... | 6007 | 6006 | 6041 | 6040 | 6139 | 6138 |
| 15 | ... | 6009 | 6008 | 6043 | 6042 | 6141 | 6140 |
| 16 | ... | 6011 | 6010 | 6045 | 6044 | 6143 | 6142 |
| 17 | ... | 6013 | 6012 | 6047 | 6046 | 6081 | 6080 |
| 18 | ... | 6015 | 6014 | 6049 | 6048 | 6083 | 6082 |
| 19 | ... | 5953 | 5952 | 6051 | 6050 | 6085 | 6084 |
| 20 | ... | 5955 | 5954 | 6053 | 6052 | 6087 | 6086 |
| 21 | ... | 5957 | 5956 | 6055 | 6054 | 6089 | 6088 |
| 22 | ... | 5959 | 5958 | 6057 | 6056 | 6091 | 6090 |
| 23 | ... | 5961 | 5960 | 6059 | 6058 | 6093 | 6092 |
| 24 | ... | 5963 | 5962 | 6061 | 6060 | 6095 | 6094 |
| 25 | ... | 5965 | 5964 | 6063 | 6062 | 6097 | 6096 |
| 26 | ... | 5967 | 5966 | 6065 | 6064 | 6099 | 6098 |
| 27 | ... | 5969 | 5968 | 6067 | 6066 | 6101 | 6100 |
| 28 | ... | 5971 | 5970 | 6069 | 6068 | 6103 | 6102 |
| 29 | ... | 5973 | 5972 | 6071 | 6070 | 6105 | 6104 |
| 30 | ... | 5975 | 5974 | 6073 | 6072 | 6107 | 6106 |
| 31 | ... | 5977 | 5976 | 6075 | 6074 | 6109 | 6108 |
| | ... | 93 | | 94 | | 95 | |
| | Codeword Object Set | | | | | | |

Figure 7A:
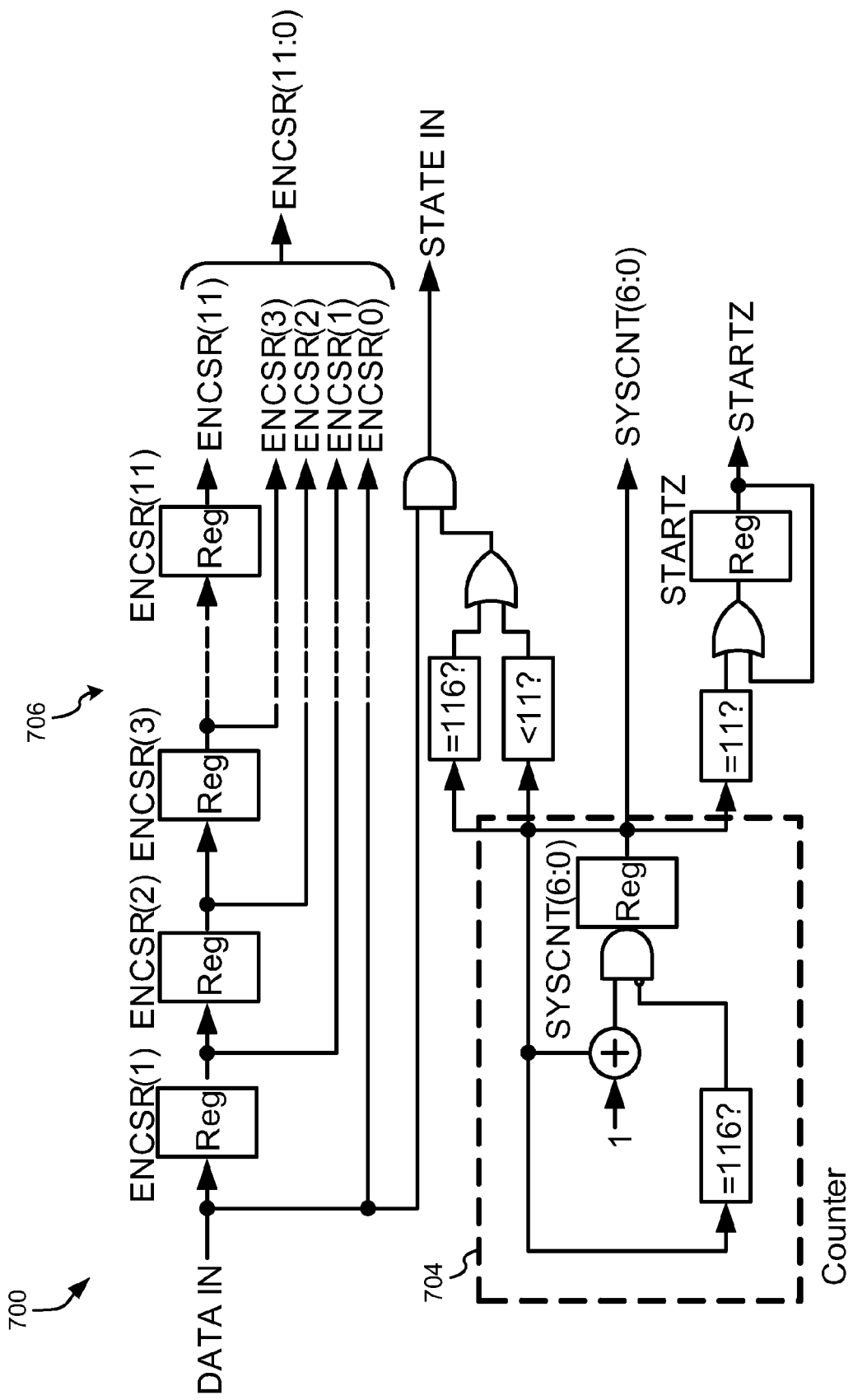
FIG. 7A shows an input interface and state counter in accordance with one embodiment.
Figure 7B:
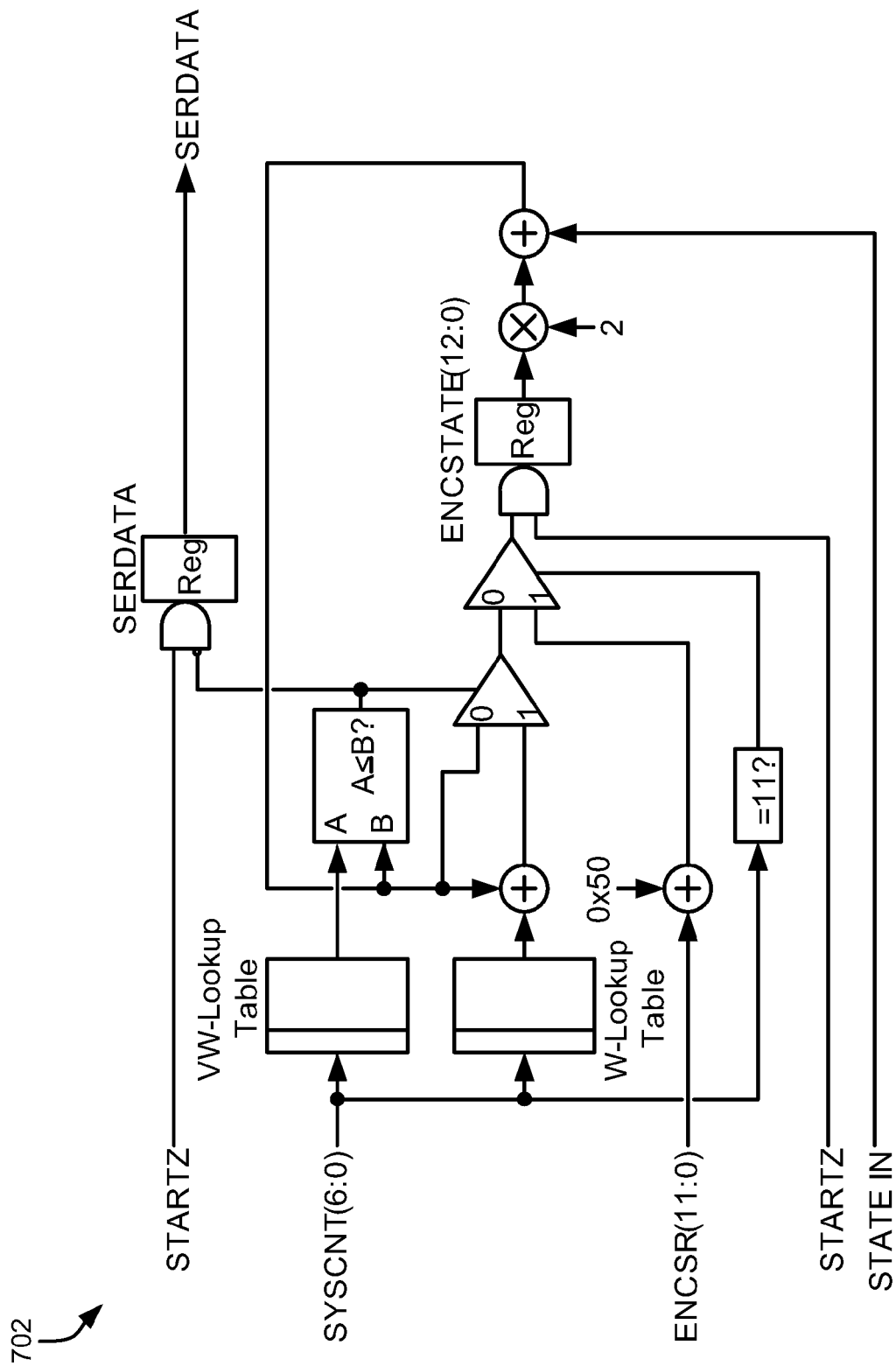
FIG. 7B shows a modulation encoder, according to one embodiment.

In one embodiment, the modulation encoder 206 may operate according to FIGS. 7A-7B to generate the even and odd interleaves of the (234,232) reverse concatenated modulation code. In this embodiment, the modulation encoder is a serial design that is capable of handling continuous data streaming. For this design, 116 input bits are received and 117 output bits are generated in the even/odd interleave, in one approach. In each interleave, the stream of 116 input bits is processed in 117 clock cycles.

Referring now to FIG. 7A, an input interface 706 and state counter 704 are shown in accordance with one embodiment. There are four outputs shown, an input shift register—ENCSR(11:0), a state counter output—SYSCNT(6:0), a start bit—STARTZ, and a gated input to the modulation encoder—STATE IN. The input data (DATA IN) is the only input shown.

The input data (DATA IN) may be brought into the input interface 706 concurrently with the system counter (SYSCNT(6:0)) being at count=0x00. The data is shifted into the shift register (Reg) as the system counter 704 counts upward. When the counter reaches 0xB (11 decimal), the shift register data is latched into the modulation encoder state machine (with an additive off set of 0x50). The input shift is only required for the serial streaming of the data—it is possible to combine this logic with the modulation encoder state machine.

The state counter—SYSCNT(6:0) 704 is used to control the modulation encoder state machine, in one approach. The counter starts at 0x00 and begins incrementing until it reaches 0x74 (116 decimal). When the counter reaches 0xB (11 decimal), the modulation encoder state machine is initialized with data from the shift register. At counts 0x74 (116 decimal) and counts 0x0 through 0xA the input to the modulation encoder is gated (set to zero) and the last remains of the encoded data are flushed from the modulation encoder.

The start bit—STARTZ keeps the modulation encoder state machine and the modulated data output bit set to zero until the system counter increments to 0xB, in one approach.

When the system counter 704 is at count 0x74 (116 decimal) and counts 0x0 through 0xA, the input to the modulation encoder is set to zero, in one approach. This enables the modulation encoder state machine to seamlessly switch between processing input data and flushing the remaining encoded data bits from the state machine.

The modulation encoder 702 is shown in FIG. 7B, in accordance with one embodiment. The primary components of the modulation encoder 702 are the modulation encoder state machine—ENCSTATE(12:0), the two lookup tables—W and VW, and the encoded output data bits—SERDATA.

The modulation encoder state machine is held at 0x0000 until the start bit is enabled when the system counter equals 0xB. Similarly, the output bit is held at zero as well.

When the system counter reaches 0xB (11 decimal), the modulation encoder state machine is loaded with data from the input shift register (with an additive offset of 0x50). After each clock, the output of the modulation encoder is multiplied by two, to which the gated input bit is added (this is a shift register operation where the encoder state machine state is shifted upwards and the input data is shifted into the least significant bit).

The output of this shift register operation is compared to the output of the VW table. If the result is greater than or equal to VW, then the W value is added to the result and latched into the encoder state machine. If the result is less than VW, then the result is loaded directly into the shift register state machine.

The two lookup tables, W and VW, may have the following characteristics, in one embodiment:

| Lookup Table W |
|---|
| W[0] = 0x02C0; |
| W[1] = 0x02A0; |
| W[2] = 0x0280; |
| W[3] = 0x0260; |
| W[4] = 0x0240; |
| W[5] = 0x0200; |
| W[6] = 0x0200; |
| W[7] = 0x0200; |
| W[8] = 0x0000; |
| W[9] = 0x0000; |
| W[10] = 0x0000; |
| W[11] = 0x0000; |
| W[12] = 0x0EA0; |
| W[13] = 0x0E90; |
| W[14] = 0x0E70; |
| W[15] = 0x0E60; |
| W[16] = 0x0E40; |
| W[17] = 0x0E30; |
| W[18] = 0x0E10; |
| W[19] = 0x0E00; |
| W[20] = 0x0DE0; |
| W[21] = 0x0DD0; |
| W[22] = 0x0DB0; |
| W[23] = 0x0DA0; |
| W[24] = 0x0D80; |

-continued

| Lookup Table W |
|---|
| W[25] = 0x0D70; |
| W[26] = 0x0D50; |
| W[27] = 0x0D40; |
| W[28] = 0x0D20; |
| W[29] = 0x0D10; |
| W[30] = 0x0CF0; |
| W[31] = 0x0CE0; |
| W[32] = 0x0CC0; |
| W[33] = 0x0CB0; |
| W[34] = 0x0C90; |
| W[35] = 0x0C80; |
| W[36] = 0x0C60; |
| W[37] = 0x0C50; |
| W[38] = 0x0C30; |
| W[39] = 0x0C20; |
| W[40] = 0x0C00; |
| W[41] = 0x0BE0; |
| W[42] = 0x0BD0; |
| W[43] = 0x0BB0; |
| W[44] = 0x0B90; |
| W[45] = 0x0B80; |
| W[46] = 0x0B60; |
| W[47] = 0x0B40; |
| W[48] = 0x0B30; |
| W[49] = 0x0B10; |
| W[50] = 0x0AF0; |
| W[51] = 0x0AE0; |
| W[52] = 0x0AC0; |
| W[53] = 0x0AA0; |
| W[54] = 0x0A80; |
| W[55] = 0x0A70; |
| W[56] = 0x0A50; |
| W[57] = 0x0A30; |
| W[58] = 0x0A10; |
| W[59] = 0x0A00; |
| W[60] = 0x09E0; |
| W[61] = 0x09C0; |
| W[62] = 0x09A0; |
| W[63] = 0x0980; |
| W[64] = 0x0960; |
| W[65] = 0x0940; |
| W[66] = 0x0920; |
| W[67] = 0x0900; |
| W[68] = 0x08E0; |
| W[69] = 0x08C0; |
| W[70] = 0x08A0; |
| W[71] = 0x0880; |
| W[72] = 0x0860; |
| W[73] = 0x0840; |
| W[74] = 0x0820; |
| W[75] = 0x0800; |
| W[76] = 0x07E0; |
| W[77] = 0x07C0; |
| W[78] = 0x07A0; |
| W[79] = 0x0780; |
| W[80] = 0x0760; |
| W[81] = 0x0740; |
| W[82] = 0x0720; |
| W[83] = 0x0700; |
| W[84] = 0x06E0; |
| W[85] = 0x06C0; |
| W[86] = 0x06A0; |
| W[87] = 0x0680; |
| W[88] = 0x0660; |
| W[89] = 0x0640; |
| W[90] = 0x0620; |
| W[91] = 0x0600; |
| W[92] = 0x05E0; |
| W[93] = 0x05C0; |
| W[94] = 0x05A0; |
| W[95] = 0x0580; |
| W[96] = 0x0560; |
| W[97] = 0x0540; |
| W[98] = 0x0520; |
| W[99] = 0x0500; |
| W[100] = 0x04E0; |
| W[101] = 0x04C0; |

| Lookup Table W |
|---|
| W[102] = 0x04A0; |
| W[103] = 0x0480; |
| W[104] = 0x0460; |
| W[105] = 0x0440; |
| W[106] = 0x0420; |
| W[107] = 0x0400; |
| W[108] = 0x03E0; |
| W[109] = 0x03C0; |
| W[110] = 0x03A0; |
| W[111] = 0x0380; |
| W[112] = 0x0360; |
| W[113] = 0x0340; |
| W[114] = 0x0320; |
| W[115] = 0x0300; |
| W[116] = 0x02E0; |

| Lookup Table VW |
|---|
| VW[0] = 0x1D44; |
| VW[1] = 0x1D68; |
| VW[2] = 0x1D90; |
| VW[3] = 0x1DC0; |
| VW[4] = 0x1E00; |
| VW[5] = 0x1E00; |
| VW[6] = 0x1E00; |
| VW[7] = 0x1E00; |
| VW[8] = 0x2000; |
| VW[9] = 0x2000; |
| VW[10] = 0x2000; |
| VW[11] = 0x2000; |
| VW[12] = 0x1162; |
| VW[13] = 0x1172; |
| VW[14] = 0x1192; |
| VW[15] = 0x11A2; |
| VW[16] = 0x11C2; |
| VW[17] = 0x11D2; |
| VW[18] = 0x11F2; |
| VW[19] = 0x1202; |
| VW[20] = 0x1222; |
| VW[21] = 0x1232; |
| VW[22] = 0x1252; |
| VW[23] = 0x1262; |
| VW[24] = 0x1282; |
| VW[25] = 0x1292; |
| VW[26] = 0x12B2; |
| VW[27] = 0x12C2; |
| VW[28] = 0x12E2; |
| VW[29] = 0x12F2; |
| VW[30] = 0x1312; |
| VW[31] = 0x1322; |
| VW[32] = 0x1342; |
| VW[33] = 0x1352; |
| VW[34] = 0x1372; |
| VW[35] = 0x1382; |
| VW[36] = 0x13A2; |
| VW[37] = 0x13B2; |
| VW[38] = 0x13D2; |
| VW[39] = 0x13E2; |
| VW[40] = 0x1402; |
| VW[41] = 0x1422; |
| VW[42] = 0x1432; |
| VW[43] = 0x1452; |
| VW[44] = 0x1472; |
| VW[45] = 0x1482; |
| VW[46] = 0x14A2; |
| VW[47] = 0x14C2; |
| VW[48] = 0x14D2; |
| VW[49] = 0x14F2; |
| VW[50] = 0x1512; |
| VW[51] = 0x1522; |
| VW[52] = 0x1542; |
| VW[53] = 0x1562; |
| VW[54] = 0x1582; |
| VW[55] = 0x1592; |

| Lookup Table VW |
|---|
| VW[56] = 0x15B2; |
| VW[57] = 0x15D2; |
| VW[58] = 0x15F2; |
| VW[59] = 0x1602; |
| VW[60] = 0x1622; |
| VW[61] = 0x1642; |
| VW[62] = 0x1662; |
| VW[63] = 0x1682; |
| VW[64] = 0x16A2; |
| VW[65] = 0x16C2; |
| VW[66] = 0x16E2; |
| VW[67] = 0x1702; |
| VW[68] = 0x1722; |
| VW[69] = 0x1742; |
| VW[70] = 0x1762; |
| VW[71] = 0x1782; |
| VW[72] = 0x17A2; |
| VW[73] = 0x17C2; |
| VW[74] = 0x17E2; |
| VW[75] = 0x1802; |
| VW[76] = 0x1822; |
| VW[77] = 0x1842; |
| VW[78] = 0x1862; |
| VW[79] = 0x1882; |
| VW[80] = 0x18A2; |
| VW[81] = 0x18C2; |
| VW[82] = 0x18E2; |
| VW[83] = 0x1902; |
| VW[84] = 0x1922; |
| VW[85] = 0x1942; |
| VW[86] = 0x1962; |
| VW[87] = 0x1982; |
| VW[88] = 0x19A2; |
| VW[89] = 0x19C2; |
| VW[90] = 0x19E2; |
| VW[91] = 0x1A02; |
| VW[92] = 0x1A22; |
| VW[93] = 0x1A42; |
| VW[94] = 0x1A62; |
| VW[95] = 0x1A82; |
| VW[96] = 0x1AA2; |
| VW[97] = 0x1AC2; |
| VW[98] = 0x1AE2; |
| VW[99] = 0x1B02; |
| VW[100] = 0x1B22; |
| VW[101] = 0x1B42; |
| VW[102] = 0x1B62; |
| VW[103] = 0x1B82; |
| VW[104] = 0x1BA2; |
| VW[105] = 0x1BC2; |
| VW[106] = 0x1BE2; |
| VW[107] = 0x1C02; |
| VW[108] = 0x1C22; |
| VW[109] = 0x1C42; |
| VW[110] = 0x1C62; |
| VW[111] = 0x1C82; |
| VW[112] = 0x1CA2; |
| VW[113] = 0x1CC2; |
| VW[114] = 0x1CE2; |
| VW[115] = 0x1D02; |
| VW[116] = 0x1D22; |

The modulation encoder, according to one embodiment, may have the following C-Code Simulation, or the like:

```
// Start Signal *******************************
******************
if (sys_counter == 11)
{
    start_in = 1;
}
else
{
    start_in = start_z;
}
```

-continued

```
// Input Shift Register ***********************************
*******************
if (sys_counter < 116)
{
    enc_sr_in = 0xFFF & ((enc_sr_z << 1) | (0x1 & data_in));
}
else
{
    enc_sr_in = enc_sr_z;
}
// Input Bit to State Machine ****************************
*******************
if ((sys_counter < 11) || (sys_counter == 116))
{
    state_in = 0;
}
else
{
    state_in = data_in;
}
// State Machine and Data Output ************************
*******************
if (sys_counter == 11)
{
    ser_data_in = 0;
    enc_state_in = enc_sr_in + 0x50;
}
else if (start_z)
{
    enc_state_in = (enc_state_z << 1) | (0x1 & state_in);
    if (enc_state_in >= VW[sys_counter])
    {
        ser_data_in = 0;
        enc_state_in = 0x1FFF & (enc_state_in + W[sys_counter]);
    }
    else
    {
        ser_data_in = 1;
    }
}
else
{
    enc_state_in = 0;
    ser_data_in = 0;
}
```

Figure 8:
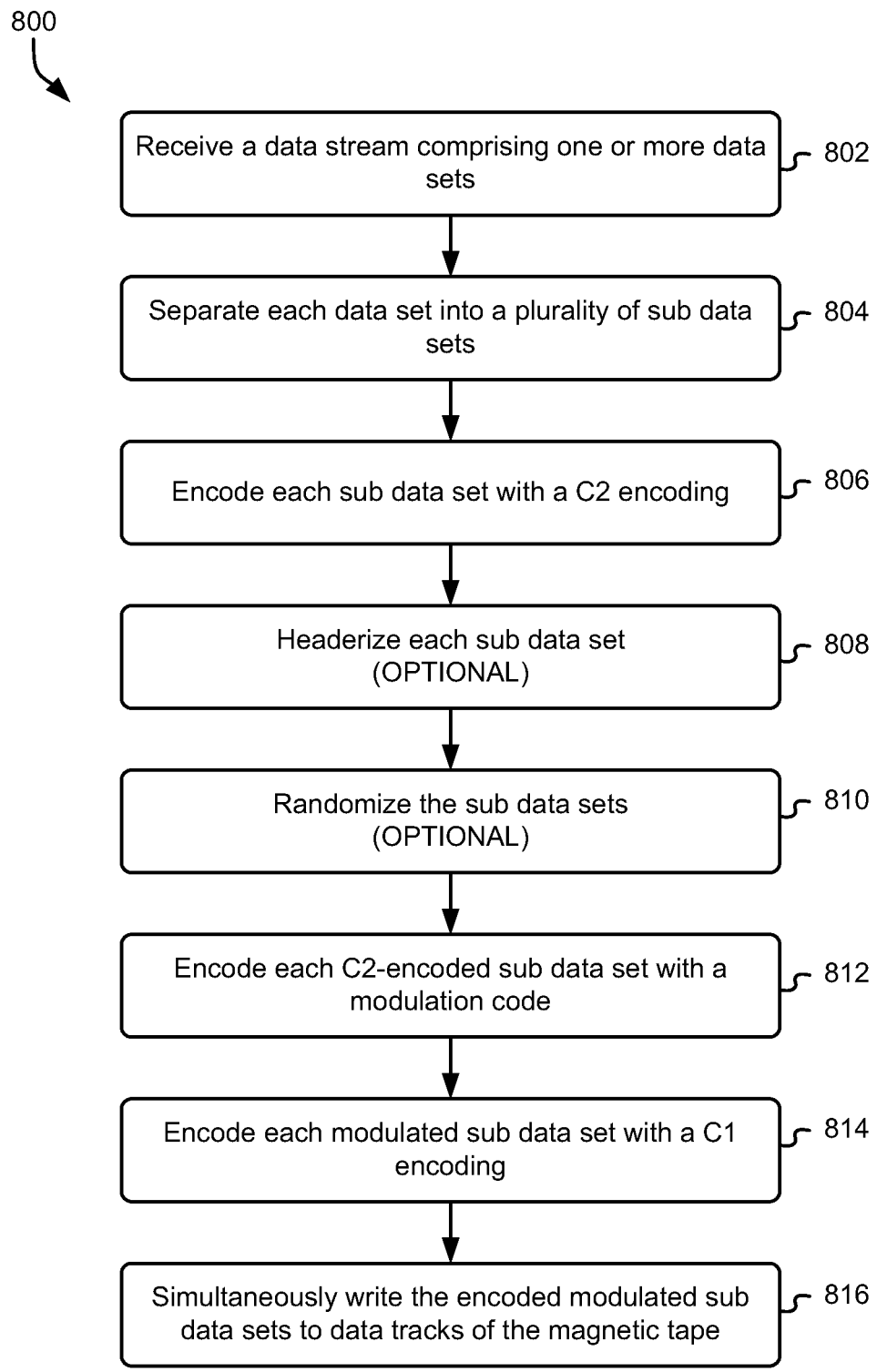
FIG. 8 shows a flowchart of a method, according to one embodiment.

Now referring to FIG. 8, a method 800 for writing data to a magnetic tape utilizing a rate-(232/234) reverse concatenated modulation code is shown according to one embodiment. As an option, the present method 800 may be implemented in the context of the functionality and architecture of FIGS. 1-7B. However, method 800 may be carried out in any desired environment. It should be noted that the aforementioned definitions may apply during the present description, and that method 800 may include more or less operations than those described herein, according to various embodiments.

In operation 802, a data stream comprising one or more data sets is received. The method 800 may be carried out in a streaming fashion or in batches, as desired by a user or suitable for the data stream.

In operation 804, each data set is separated into a plurality of sub data sets. In one embodiment, each data set may be separated into sixty-four sub data sets, each sub data set organized as an 84×918-byte matrix being 77,112 bytes in size.

In operation 806, each sub data set is encoded with a C2 encoding code. In one approach, the encoding with a C2 encode may comprise adding twelve bytes of C2 ECC to each 84-byte column of each sub data set's matrix, creating a 96×918-byte matrix being 88,128 bytes in size. In one embodiment, the C2 encoding may comprise a (96,84,13) Reed-Solomon ECC, or some other ECC known in the art.

In optional operation 808, each sub data set is headerized. This operation is described as being optional because there may be other ways of identifying the sub data sets besides headerizing each of them. Any other method of identifying the sub data sets may be used, as known in the art. According to one approach, the headerizing may comprise adding a 10-byte header to each row of each C2-encoded sub data set's 96×918-byte matrix to create a 96×928-byte matrix for each headerized sub data set being 89,088 bytes in size.

In optional operation 810, the sub data sets are randomized. This operation is described as being optional because there may be other ways of ensuring that the sub data sets consist of essentially random data before they are encoded by the modulation encoder. Any other method of ensuring that the data sets are essentially random, for instance, by compression and encryption of user data, may be used, as known in the art. In one embodiment, each row (CW-4) of each headerized sub data set's 96×928-byte matrix may be randomized to create a randomized 96×928-byte matrix.

In operation 812, each C2-encoded sub data set is encoded with a modulation code. In one embodiment, the modulation coding may comprise applying a (234,232) modulation code to each randomized 96×928-byte matrix by extending a length of each CW-4 by eight bytes to create a 96×936-byte matrix being 89,856 bytes in size.

In operation 814, each modulated sub data set is encoded with a C1 encoding. According to one embodiment, the C1 encoding may comprise applying a (1992, 1872) LDPC code to each sub data set by adding four LDPC codewords to each CW-4 to create a 96×996-byte matrix being 95,616 bytes in size.

In operation 816, the encoded modulated sub data sets are simultaneously written to data tracks of the magnetic tape. In one embodiment, the simultaneous writing may comprise writing designated CW-4's in sets of 32 simultaneously to the magnetic tape.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for writing data to a magnetic tape utilizing a rate-(232/234) reverse concatenated modulation code, the method comprising:
   receiving a data stream comprising one or more data sets;
   separating each data set into a plurality of sub data sets;

encoding each sub data set with a C2 code to produce C2-encoded sub data sets;

encoding each C2-encoded sub data set with the rate-(232/234) reverse concatenated modulation code to produce modulated sub data sets;

encoding each modulated sub data set with a C1 code to produce C1-encoded modulated sub data sets; and simultaneously writing the C1-encoded modulated sub data sets to data tracks of the magnetic tape.

2. The method as recited in claim 1, wherein the separating each data set into a plurality of sub data sets comprises creating sixty-four sub data sets from each data set, each sub data set organized as an 84×918-byte matrix being 77,112 bytes in size.

3. The method as recited in claim 2, wherein the encoding each sub data set with the C2 code adds twelve bytes of C2 error correction code (ECC) to each 84-byte column of each sub data set's matrix, creating a 96×918-byte matrix being 88,128 bytes in size, wherein the C2 code comprises a (96, 84,13) Reed-Solomon ECC.

4. The method as recited in claim 3, further comprising headerizing each sub data set by adding a 10-byte header to each row of each C2-encoded sub data set's 96x918-byte matrix to create a 96x928-byte matrix for each headerized sub data set being 89,088 bytes in size.

5. The method as recited in claim 4, further comprising randomizing each row (CW-4) of each headerized sub data set's 96x928-byte matrix to create a randomized 96x928-byte matrix.

6. The method as recited in claim 5, wherein the encoding each C2-encoded sub data set with the modulation code comprises applying a (234,232) modulation code to each randomized 96x928-byte matrix by extending a length of each CW-4 by eight bytes to create a 96x936-byte matrix being 89,856 bytes in size.

7. The method as recited in claim 6, wherein the C1 code comprises a (1992, 1872) low-density parity check (LDPC) code, and wherein the encoding each modulated sub data set with the C1 code comprises applying the (1992, 1872) LDPC code to each sub data set by concatenating four LDPC codewords to each CW-4 to create a 96x996-byte matrix being 95,616 bytes in size.

8. The method as recited in claim 7, wherein the simultaneously writing the C1-encoded modulated sub data sets to data tracks of the magnetic tape comprises writing designated CW-4's in sets of 32 simultaneously to the magnetic tape.

9. A method for writing data to a magnetic tape, the method comprising:

receiving a data stream comprising one or more data sets;

separating each data set into a plurality of sub data sets;

encoding each sub data set with a C2 code to produce C2-encoded sub data sets;

encoding each C2-encoded sub data set with a modulation code to produce modulated sub data sets;

encoding each modulated sub data set with a C1 code to produce C1-encoded modulated sub data sets; and simultaneously writing the C1-encoded modulated sub data sets to a plurality of data tracks of the magnetic tape, wherein the modulation code is a reverse concatenated modulation code.

10. The method as recited in claim 9, wherein the separating each data set into a plurality of sub data sets comprises creating sixty-four sub data sets from each data set, each sub data set organized as an 84x918-byte matrix being 77,112 bytes in size, and wherein the encoding each sub data set with the C2 encoding code adds twelve bytes of C2 error correction code (ECC) to each 84-byte column of each sub data set's matrix, creating a 96x918-byte matrix being 88,128 bytes in size, wherein the C2 encoding code comprises a (96,84,13) Reed-Solomon ECC.

11. The method as recited in claim 10, further comprising headerizing each C2-encoded sub data set by adding a 10-byte header to each row of each C2-encoded sub data set's 96x918-byte matrix to create a 96x928-byte matrix such that each headerized sub data set is 89,088 bytes in size.

12. The method as recited in claim 11, further comprising randomizing each row (CW-4) of each headerized sub data set's 96x928-byte matrix to create a randomized 96x928-byte matrix.

13. The method as recited in claim 12, wherein the encoding each C2-encoded sub data set with the modulation code comprises applying a (234,232) modulation code to each randomized 96x928-byte matrix by extending a length of each CW-4 by eight bytes to create a 96x936-byte matrix being 89,856 bytes in size.

14. The method as recited in claim 13, wherein the C1 code comprises a (1992,1872) low-density parity check (LDPC) code, and wherein the encoding each modulated sub data set with the C1 code comprises applying the (1992,1872) LDPC code to each sub data set by concatenating four LDPC codewords to each CW-4 to create a 96x996-byte matrix being 95,616 bytes in size.

15. The method as recited in claim 14, wherein the writing the C1-encoded modulated sub data sets to the plurality of data tracks of the magnetic tape comprises writing designated CW-4's in sets of 32 simultaneously to the magnetic tape.

* * * * *